US012610629B2

(12) United States Patent
Wang

(10) Patent No.: US 12,610,629 B2
(45) Date of Patent: Apr. 21, 2026

(54) CHARGED-PARTICLE DETECTOR PACKAGE FOR HIGH SPEED APPLICATIONS

(71) Applicant: ASML NETHERLANDS B.V., Veldhoven (NL)

(72) Inventor: Yongxin Wang, San Ramon, CA (US)

(73) Assignee: ASML Netherlands B.V., Veldhoven (NL)

( * ) Notice: Subject to any disclaimer, the term of this patent is extended or adjusted under 35 U.S.C. 154(b) by 1024 days.

(21) Appl. No.: 17/774,130

(22) PCT Filed: Oct. 30, 2020

(86) PCT No.: PCT/EP2020/080608
§ 371 (c)(1),
(2) Date: May 3, 2022

(87) PCT Pub. No.: WO2021/089443
PCT Pub. Date: May 14, 2021

(65) Prior Publication Data
US 2022/0393057 A1 Dec. 8, 2022

Related U.S. Application Data

(60) Provisional application No. 62/931,123, filed on Nov. 5, 2019.

(51) Int. Cl.
*H10F 30/29* (2025.01)
*H01J 37/244* (2006.01)
(Continued)

(52) U.S. Cl.
CPC ............ *H10F 30/29* (2025.01); *H01J 37/244* (2013.01); *H01L 24/48* (2013.01); *H10F 77/50* (2025.01);
(Continued)

(58) Field of Classification Search
None
See application file for complete search history.

(56) References Cited

U.S. PATENT DOCUMENTS

2002/0074494 A1* 6/2002 Lundquist ........... H01J 37/3056
250/307
2007/0065079 A1 3/2007 Mitamura
(Continued)

FOREIGN PATENT DOCUMENTS

CN 1450410 A 10/2003
CN 201766105 U 3/2011
(Continued)

OTHER PUBLICATIONS

Office Action issued by the Intellectual Property Office (IPO) in related ROC (Taiwan) Patent Application No. 109137566, mailed Jul. 14, 2021 (7 pgs.).
(Continued)

*Primary Examiner* — Hung K Vu
(74) *Attorney, Agent, or Firm* — Finnegan, Henderson, Farabow, Garrett & Dunner LLP

(57) ABSTRACT

A charged particle beam system may include a detector. A package for a detector may have a package body that includes two sets of pins, each of the sets of pins including two pins. Each pin of the sets of pins may be configured to be connected to one of two terminals of a sensing element. Pins of different sets may be configured to be connected to a different one of the two terminals of the diode. The sets of pins may be arranged with a symmetry such that magnetic fields generated when current passes through the sets of pins is reduced due to the symmetry.

19 Claims, 23 Drawing Sheets

(51) Int. Cl.
H01L 23/00 (2006.01)
H10F 77/00 (2025.01)
H10F 77/50 (2025.01)

(52) U.S. Cl.
CPC ........ H10F 77/933 (2025.01); H01J 2237/28 (2013.01); H01L 2224/48225 (2013.01)

(56) References Cited

U.S. PATENT DOCUMENTS

| | | | |
|---|---|---|---|
| 2007/0262404 A1 | 11/2007 | Meyer et al. | |
| 2013/0187057 A1 | 7/2013 | Kobayashi et al. | |
| 2015/0279752 A1* | 10/2015 | Yokoyama ............ | H01L 23/057 |
| | | | 257/676 |
| 2019/0020319 A1 | 1/2019 | Umezawa et al. | |

FOREIGN PATENT DOCUMENTS

| | | | |
|---|---|---|---|
| JP | H09107150 A | 4/1997 | |
| JP | 2885149 B2 | 4/1999 | |
| JP | 2011-145292 A | 7/2011 | |
| TW | 201327718 A | 7/2013 | |

OTHER PUBLICATIONS

International Search Report and Written Opinion received from the International Search Authority issued in related International Application No. PCT/EP2020/080608, mailed Dec. 3, 2020 (9 pgs.).

\* cited by examiner

CHARGED-PARTICLE DETECTOR PACKAGE FOR HIGH SPEED APPLICATIONS

CROSS-REFERENCE TO RELATED APPLICATIONS

This application claims priority to International Application No. PCT/EP2020/080608, filed Oct. 30, 2020, and published as WO 2021/089443 A1, which claims priority of U.S. application 62/931,123 which was filed on Nov. 5, 2019. The contents of these applications are incorporated herein by reference in their entireties.

FIELD

The description herein relates to detectors that may be useful in the field of charged particle beam systems, and more particularly, to a large active area detector package that may be useful in applications demanding high speed.

BACKGROUND

In manufacturing processes of integrated circuits (ICs), unfinished or finished circuit components may be inspected to ensure that they are manufactured according to design and are free of defects. Inspection may be done by a charged particle beam system that scans a primary beam across a sample and collects secondary particles generated from the sample at a detector.

Lately, as the size of ICs and other structures on semiconductor chips has continued to shrink, inspection tools based on a scanning electron microscope (SEM) have gained attention. An electron beam tool, such as a SEM, may project one or more electron beams onto the surface of a sample and may detect a secondary electron beam or beams emitted from the sample. By correlating information (e.g., intensity) relating to the secondary electron beam(s) with the scan path of the primary beam(s), a reconstructed image of the sample may be acquired. The image may provide information about the sample such as surface profile, material properties, and alignment information between different layers.

SUMMARY

Embodiments of the present disclosure provide systems and methods for imaging based on charged particle beams. In some embodiments, there may be provided a charged particle beam system that includes a detector. A package for a detector may include a package body that includes two sets of pins, each of the sets of pins including two pins. Each pin of the sets of pins may be configured to be connected to a different one of two terminals of a sensing element that may include a semiconductor diode. The sets of pins may be arranged with a symmetry such that magnetic fields generated when current passes through the sets of pins is reduced due to the symmetry.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings.

FIG. 4D illustrates an exemplary module that a detector package may be connected to, consistent with embodiments of the present disclosure.

DETAILED DESCRIPTION

Figure 1:
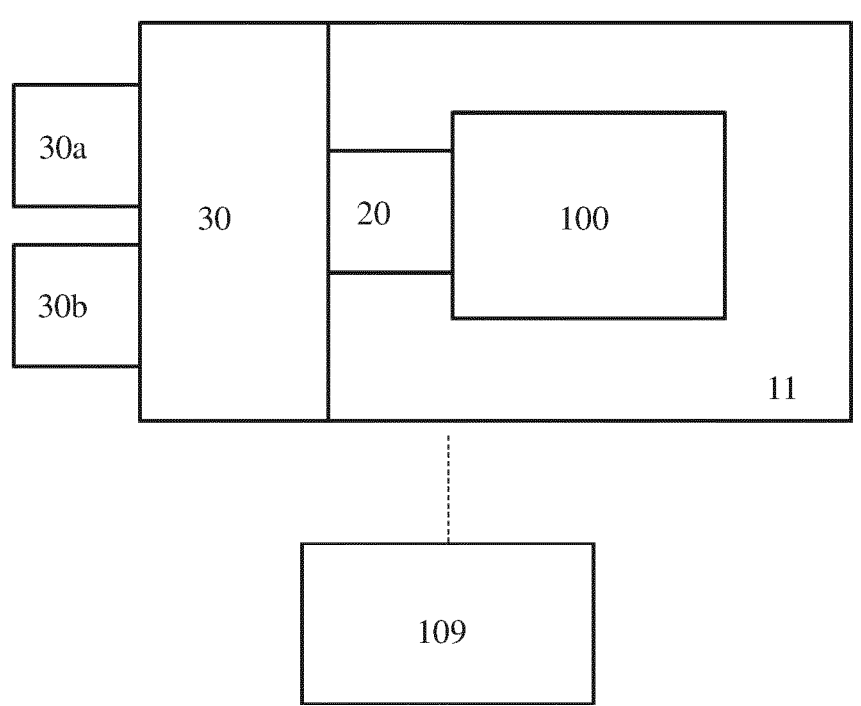
FIG. 1 is a schematic diagram illustrating an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Electronic devices are constructed of circuits formed on a piece of silicon called a substrate. Many circuits may be formed together on the same piece of silicon and are called integrated circuits or ICs. With advancements in technology, the size of these circuits has decreased dramatically so that many more of them can fit on the substrate. For example, an IC chip in a smart phone can be as small as a thumbnail and yet may include over 2 billion transistors, the size of each transistor being less than $\frac{1}{1,000}$th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur. To enhance throughput (e.g., the number of samples processed per hour), it is desirable to conduct inspection as quickly as possible.

An image of a wafer may be formed by scanning a primary beam of a SEM system over the wafer and collecting particles (e.g., secondary electrons) generated from the wafer surface at a detector. Secondary electrons landing on the detector may cause electrical signals to be generated in the detector. These signals may be output from the detector and may be processed by an image processor to form the image of the sample.

To process samples faster (e.g., to improve throughput), a SEM may be operated to scan the sample faster, thereby increasing the "pixel rate" (e.g., the rate at which pixels of the resulting image are formed). However, there are a variety of competing constraints in designing a detector when attempting to improve performance of the detector to enable faster processing.

One of such constraints includes packaging. A SEM system may have a configuration such that the detector is electrically connected to some other components in the system by pins. For example, a detector may connect to a module that has receiver sockets into which pins may be inserted. The use of pins may enable easy assembly and replacement of parts. Pins may be easy to service and have high compatibility, since they may be a standardized component.

However, existing packaging designs, such as those using pins, may encounter issues with electromagnetic effects including, for example, parasitic inductance. Inductance refers to the property of a component such as an electric conductor or circuit to resist a change in the current flowing through it. Inductance depends on the physical arrangement of the component and its material makeup. Pins may have a large conductive path (e.g., a thick pin shaft) and may make a large contribution to parasitic inductance.

Parasitic inductance may affect other parameters of the detector. For example, high parasitic inductance may limit the maximum operating speed of the detector. A detector may be configured to have low internal resistance, which may in turn contribute to high "Q-factor." The parameter of Q-factor may refer to a measure of energy loss or self-resonance in an electronic device. With lower energy loss, system oscillations may be larger and may die out slower. However, the combination of parasitic inductance and high Q-factor may mean that performance of a detector may be impeded at frequency ranges where it would be beneficial to operate the detector for enabling high-speed imaging. For example, there may be irregular response at high frequency, thus limiting the usefulness of the upper frequency range, which may be the range most useful for high-speed image channel operation. Being restricted from using the upper frequency range may mean that the detector cannot be operated as fast or as efficiently as possible, and thus throughput cannot be improved because the detector takes longer to process electrical signals.

Embodiments of the disclosure may address some issues of detectors using pins. For example, a detector package may be provided that reduces contribution of parasitic inductance without sacrificing some of the benefits of using pins. Accordingly, the use of pins may be maintained. A package may be provided that includes groups of pins, arranged alternately, such that parasitic parameters (e.g., parasitic inductances) may be reduced or cancelled out. The physical arrangement of the pins and other electrical components may be such that the influence of magnetic fields generated by the pins is reduced. A magnetic field that is generated by current flow through one pin may reduce a magnetic field that is generated by current flow through another pin.

Inductance may be related to the flow of electric current through a conductor. The flow of current in a conductor may create a magnetic field around the conductor with magnetic field strength that depends Oil the magnitude of the current. The magnetic field may be visualized according to the "right hand rule," that is, that when the thumb of one's right hand points in the direction of current flow along the length of a conductor, the fingers of the hand curl in the direction of magnetic field around the conductor. An example of this effect may be shown in FIG. 4F.

The magnetic field generated by current flow through a conductor may be related to parasitic inductance. Current flowing through a detector may be dynamic. For example, current may be generated in a detector in response to secondary electrons arriving on the detector, and the secondary electrons arriving on the detector may change as the primary beam of a charged particle beam system scans from location to location on a wafer. For example, the rate of arrival and the energy of secondary electrons landing on the detector may change along the scan path, and current generated in the detector may vary accordingly. Changes in current flowing through a conductor may cause changes in magnetic field strength around the conductor. Changes in magnetic field strength induce an electromotive force in the conductor that opposes the voltage that may be generating the change in current (e.g., "back emf"). This phenomenon may be known as electromagnetic induction and may adversely affect the performance of a detector.

A pin may be a relatively large conductive structure in an electronic circuit included in a detector. Due the size and geometry of a detector including pins, a magnetic field may be generated that adversely affects performance. For example, a typical detector may include a sensing element with one pin connected to the anode (e.g., a positive electrode) of the sensing element and one pin connected to the cathode (e.g., a negative electrode) of the sensing element. The direction of current flow may be opposite between the two pins. Thus, a magnetic field may be formed curling in one direction around the first pin and a magnetic field may be formed curling in an opposite direction around the second pin. Magnetic fields may obey the superposition principle, meaning that at a point encompassed by two magnetic fields, the net effect of the magnetic fields at the point may be equal to the sum of the response caused by each of the two fields individually. At a point between two pins, the response of a first field (due to a first pin) may be in the same direction as that of a second field (due to a second pin). If the response due to the respective fields is in the same direction, they may be added together. Thus, there may be a region between the two pins where the influence of the magnetic field becomes larger, and this may affect parasitic inductance. Parasitic inductance may be a significant factor contributing to difficulty in operating a detector at high speed.

In some embodiments of the disclosure, a detector package may include a sensing element with a first group of pins and a second group of pins. Multiple pins may be connected to the anode of a detection system, and multiple pins may be connected to the cathode of the detection system. This may divide current flowing in the same direction between multiple pins, and inductance generated by current flow in each of the pins may be reduced. Reduction of inductance may be relative to a case in which current flows between a cathode and one pin, and when current flows between an anode and one pin. Furthermore, each group of pins may include pins in which current flow is opposite in direction. Each group of pins may be placed in close proximity to a connecting point between an electrode (e.g., an anode or cathode of the detection system) and a terminal of the sensing element. For example, two pins, one connected to the anode and one connected to the cathode, may be placed near a bonding wire landing pad. Pins may be configured such that influence of magnetic fields generated by the pins, obeying the superposition principle, may subtract from one another in some regions, rather than be added to one another.

Additionally, pins may be arranged alternately. Each group of pins may include a pin connected to the anode and a pin connected to the cathode. The arrangement of pins in the first group may be opposite that in the second group. For example, in the first group, the cathode-connected pin may be closer to the sensing element, and in the second group, the anode-connected pin may be closer to the sensing element. A pin arrangement may be used that reduces or eliminates parasitic inductance in a detector package. Reduction of parasitic inductance may be relative to a case in which only one pin is connected to a cathode and only one pin is connected to an anode. Cancellation of opposing magnetic fields may be achieved in some regions in and around the detector package. Thus, the energy that a magnetic field can store may be minimized or even reduced to zero (or nearly zero). In this way, parasitic inductance in a detector package may be largely reduced or eliminated.

Objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the present disclosure, some embodiments may be described in the context of providing detection systems and detection methods in systems utilizing electron beams ("e-beams"). However, the disclosure is not so limited. Other types of charged particle beams may be similarly applied. Furthermore, systems and methods for detection may be used in other imaging systems, such as optical imaging, photon detection, x-ray detection, ion detection, etc.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 10 that may be used for detection, consistent with embodiments of the present disclosure. EBI system 10 may include a scanning electron microscope (SEM) and may be used for imaging. As shown in FIG. 1, EBI system 10 includes a main chamber 11 a load/lock chamber 20, an electron beam tool 100, and an equipment front end module (EFEM) 30. Electron beam tool 100 is located within main chamber 11. EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown) which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 109 is electronically connected to electron beam tool 100, and may be electronically connected to other components as well. Controller 109 may be a computer configured to execute various controls of EBI system 10. While controller 109 is shown in FIG. 1 as being outside of the structure that includes main chamber 11, load/lock chamber 20, and EFEM 30, it is appreciated that controller 109 can be part of the structure.

A charged particle beam microscope, such as that formed by or which may be included in EBI system 10, may be capable of resolution down to, e.g., the nanometer scale, and may serve as a practical tool for inspecting IC components on wafers. With an e-beam system, electrons of a primary electron beam may be focused at probe spots on a wafer under inspection. The interactions of the primary electrons with the wafer may result in secondary particle beams being formed. The secondary particle beams may comprise back-scattered electrons, secondary electrons, or Auger electrons, etc. resulting from the interactions of the primary electrons with the wafer. Characteristics of the secondary particle beams (e.g., intensity) may vary based on the properties of the internal or external structures of the wafer, and thus may indicate whether the wafer includes defects.

The intensity of the secondary particle beams may be determined using a detector. The secondary particle beams may form beam spots on a surface of the detector. The detector may generate electrical signals (e.g., a current, a voltage, etc.) that represent intensity of the detected second-ary particle beams. The electrical signals may be measured with measurement circuitries which may include further components (e.g., analog-to-digital converters) to obtain a distribution of the detected electrons. The electron distribu-tion data collected during a detection time window, in combination with corresponding scan path data of the pri-mary electron beam incident on the wafer surface, may be used to reconstruct images of the wafer structures under inspection. The reconstructed images may be used to reveal various features of the internal or external structures of the wafer and may be used to reveal defects that may exist in the wafer.

Figure 2:
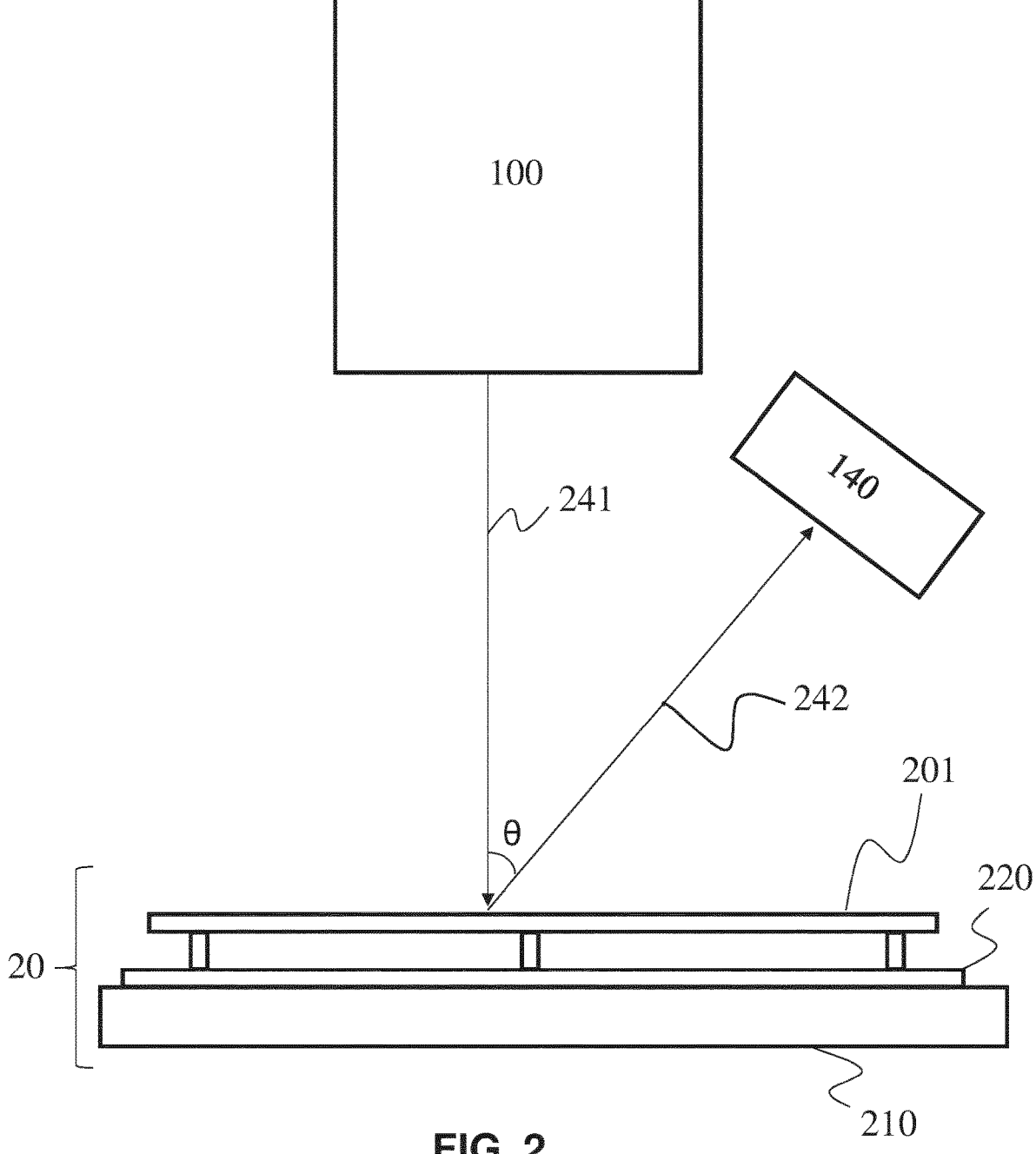
FIG. 2 is a schematic diagram of an exemplary arrangement of a wafer included in a load/lock chamber, consistent with embodiments of the present disclosure that may be a part of the exemplary electron beam inspection system of FIG. 1.

FIG. 2 illustrates an exemplary arrangement of a wafer 201 that may be included in main chamber 11 and other components of EBT system 10, consistent with embodi-ments of the present disclosure. Structures may be provided for holding wafer 201 within EBI system 10. For example, as shown in FIG. 2, main chamber 11 may include a bottom plate 220 disposed on a stage 210 with wafer standoffs provided for holding wafer 201. Stage 210 may be movable.

Electron beam tool 100 may be configured to generate a primary beam 241 that may be projected on wafer 201. Electron beam tool 100 may include a primary source configured to emit a charged particle beam along an optical axis onto a region of a sample, such as wafer 201. The optical axis of the primary source may be configured to be perpendicular to the sample. Stage 210 may be adjusted so that X, Y, Z positions, tilt, angular orientation, etc. of wafer 201 can be fine-tuned. Stage 210 may be moved to align a desired inspection area on wafer 201 to be within a field of view (FOV) of electron beam tool 100. The FOV of electron beam tool 100 may be defined by the range within which electron beam tool 100 is configured to deflect primary beam 241. In some embodiments, electron beam tool 100 may include a large-FOV device that may be configured to scan primary beam 241 across a broad area on wafer 201. In some embodiments, electron beam tool 100 may be configured to generate and may deflect a plurality of beams toward wafer 201. For example, electron beam tool 100 may include a multi-beam tool. In some embodiments, electron beam tool 100 may be configured to project primary beam 241 straight down while stage 210 is configured to move wafer 201 through a variety of scan positions.

As shown in FIG. 2, a secondary beam 242 may be generated at the surface of wafer 201 in response to inci-dence of primary beam 241. Secondary beam 242 may be directed toward a detector 140. Particles in the secondary beam may have different trajectories depending on, for example, initial kinetic energy and emission angle from wafer 201. Although FIG. 2 shows secondary beam 242 directed toward detector 140 at an angle θ relative to the optical axis of electron beam tool 100, it will be understood that particles may arrive at detector 140 with a geometric spread of landing positions. Representation of secondary beam 242 as a single line may be merely schematic. A beam spot may be formed on the surface of detector 140 that may be larger than a beam spot formed on the surface of wafer 201. Accordingly, the overall size of the detection surface of detector 140 may be configured to be large enough to accommodate a relatively broad beam spot. Detector 140 may also be configured to have a relatively large active area that may receive particles of secondary beam 242. The active area of detector 140 may correspond to the area of a surface of a sensing element, the surface configured to face wafer 201 and receive secondary particles.

Figure 3A:
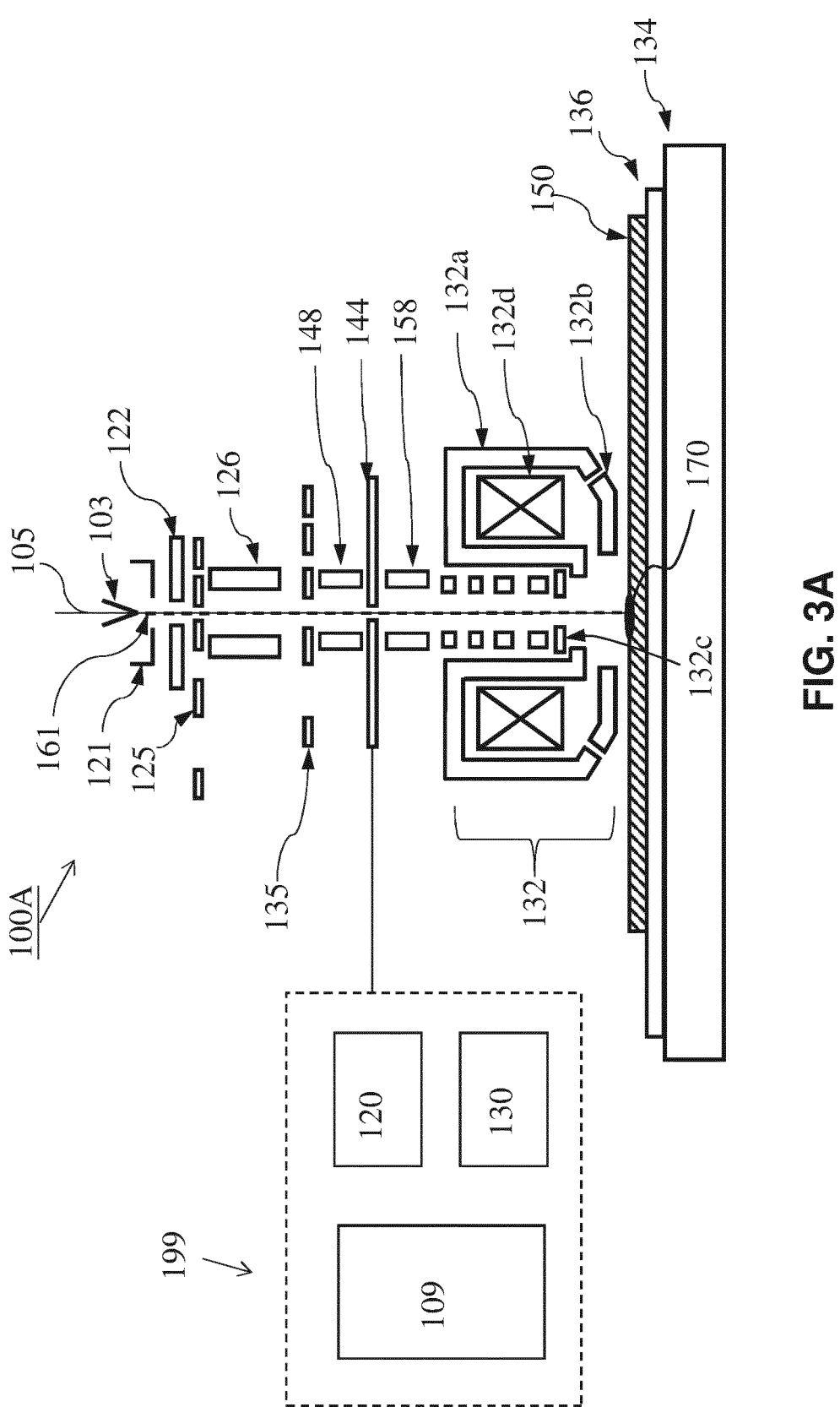
FIGS. 3A and 3B are diagrams illustrating a charged particle beam apparatus that may be an example of an electron beam tool, consistent with embodiments of the present disclosure.

FIG. 3A illustrates a charged particle beam apparatus that may be an example of electron beam tool 100, consistent with embodiments of the present disclosure. FIG. 3A shows an apparatus in which an inspection system may comprise a single-beam inspection tool that uses only one primary electron beam to scan one location on a wafer at a time.

As shown in FIG. 3A, an electron beam tool 100A (also referred to herein as apparatus 100A) may be a single-beam inspection tool that is used in EBI system 10. Apparatus 100A includes a wafer holder 136 supported by motorized stage 134 to hold a wafer 150 to be inspected. Electron beam tool 100A includes an electron emitter, which may comprise a cathode 103, an anode 121, and a gun aperture 122. Electron beam tool 100A further includes a beam limit aperture 125, a condenser lens 126, a column aperture 135, an objective lens assembly 132, and a detector 144. Objec-tive lens assembly 132, in some embodiments, may be a modified SORIL lens, which includes a pole piece 132a, a control electrode 132b, a deflector 132c, and an exciting coil 132d. In an imaging process, an electron beam 161 emanat-ing from the tip of cathode 103 may be accelerated by anode 121 voltage, pass through gun aperture 122, beam limit aperture 125, condenser lens 126, and be focused into a probe spot 170 by the modified SORIL lens and impinge onto the surface of wafer 150. Probe spot 170 may be scanned across the surface of wafer 150 by a deflector, such as deflector 132c or other deflectors in the SORIL lens. Secondary or scattered primary particles, such as secondary electrons or scattered primary electrons emanated from the wafer surface may be collected by detector 144 to determine intensity of the beam and so that an image of an area of interest on wafer 150 may be reconstructed.

There may also be provided an image processing system 199 that includes an image acquirer 120, a storage 130, and controller 109. Image acquirer 120 may comprise one or more processors. For example, image acquirer 120 may comprise a computer, server, mainframe host, terminals, personal computer, any kind of mobile computing devices, and the like, or a combination thereof. Image acquirer 120 may connect with detector 144 of electron beam tool 100A through a medium such as an electrical conductor, optical fiber cable, portable storage media, IR, Bluetooth, internet, wireless network, wireless radio, or a combination thereof. Image acquirer 120 may receive a signal from detector 144 and may construct an image. Image acquirer 120 may thus acquire images of wafer 150. Image acquirer 120 may also perform various post-processing functions, such as generat-ing contours, superimposing indicators on an acquired image, and the like. Image acquirer 120 may be configured to perform adjustments of brightness and contrast, etc. of acquired images. Storage 130 may be a storage medium such as a hard disk, random access memory (RAM), cloud storage, other types of computer readable memory, and the like. Storage 130 may be coupled with image acquirer 120 and may be used for saving scanned raw image data as original images, and post-processed images. Image acquirer

120 and storage 130 may be connected to controller 109. In some embodiments, image acquirer 120, storage 130, and controller 109 may be integrated together as one electronic control unit.

In some embodiments, image acquirer 120 may acquire one or more images of a sample based on an imaging signal received from detector 144. An imaging signal may correspond to a scanning operation for conducting charged particle imaging. An acquired image may be a single image comprising a plurality of imaging areas that may contain various features of wafer 150. The single image may be stored in storage 130. Imaging may be performed on the basis of imaging frames.

The condenser and illumination optics of the electron beam tool may comprise or be supplemented by electromagnetic quadrupole electron lenses. For example, as shown in FIG. 3A, electron beam tool 100A may comprise a first quadrupole lens 148 and a second quadrupole lens 158. In some embodiments, the quadrupole lenses may be used for controlling the electron beam. For example, first quadrupole lens 148 may be controlled to adjust the beam current and second quadrupole lens 158 may be controlled to adjust the beam spot size and beam shape.

FIG. 3A illustrates a charged particle beam apparatus in which an inspection system may use a single primary beam that may be configured to generate secondary electrons by interacting with wafer 150. Detector 144 may be placed along optical axis 105, as in the embodiment shown in FIG. 3A. The primary electron beam may be configured to travel along optical axis 105. Accordingly, detector 144 may include a hole at its center so that the primary electron beam may pass through to reach wafer 150. FIG. 3A shows an example of detector 144 having an opening at its center. However, some embodiments may use a detector placed off-axis relative to the optical axis along which the primary electron beam travels. For example, as in the embodiment shown in FIG. 3B, discussed below, a beam separator 222 may be provided to direct secondary electron beams toward a detector placed off-axis. Beam separator 222 may be configured to divert secondary electron beams by an angle α toward an electron detection device 244, as shown in FIG. 3B.

Another example of a charged particle beam apparatus will now be discussed with reference to FIG. 3B. An electron beam tool 100B (also referred to herein as apparatus 100B) may be an example of electron beam tool 100 and may be similar to electron beam tool 100A shown in FIG. 3A. However, different from apparatus 100A, apparatus 100B may comprise a multi-beam inspection tool that uses multiple primary electron beamlets to simultaneously scan multiple locations on a sample.

Figure 3B:
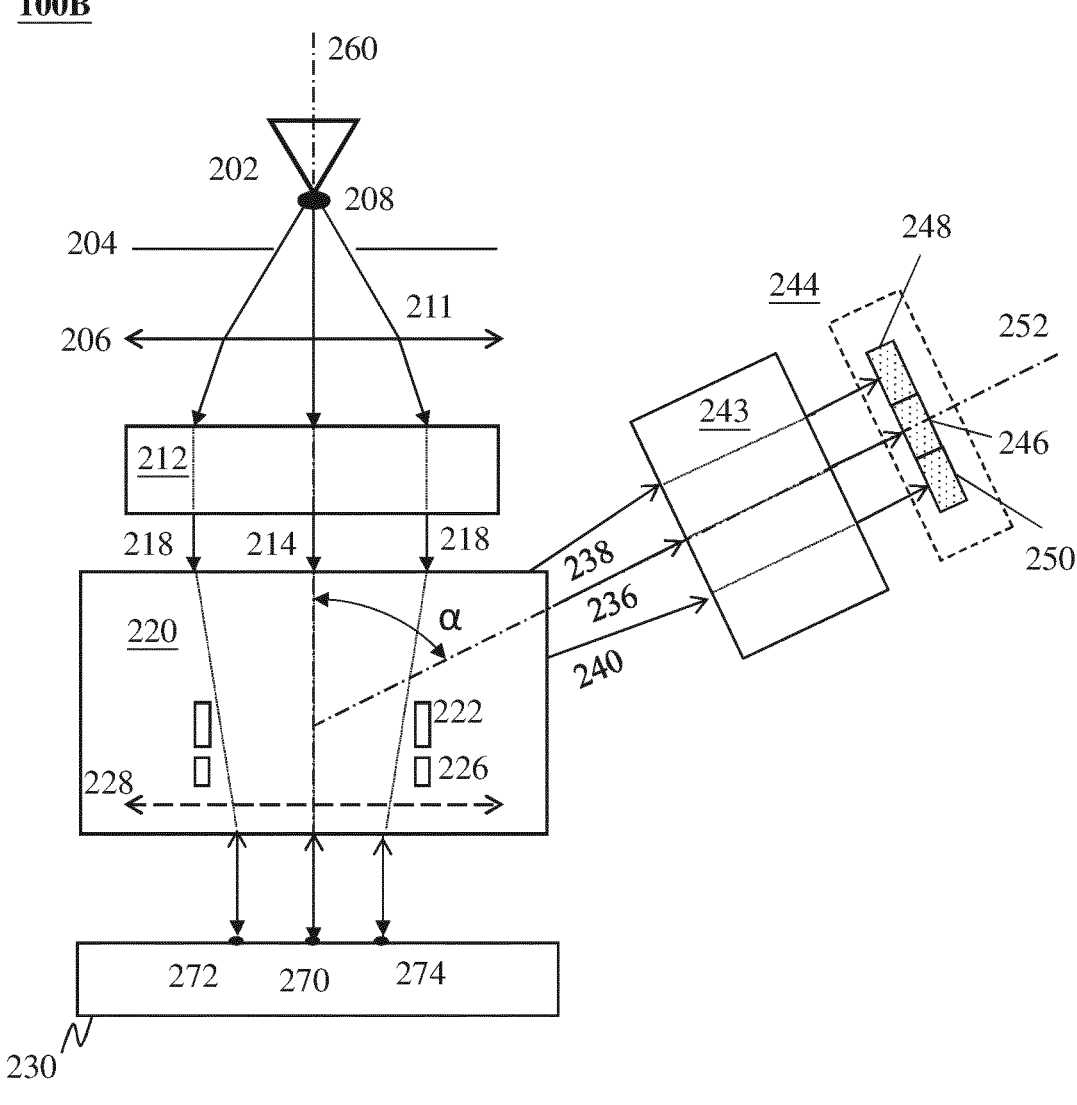

As shown in FIG. 3B, electron beam tool 100B may comprise an electron source 202, a gun aperture 204, a condenser lens 206, a primary electron beam 211 emitted from electron source 202, a source conversion unit 212, a plurality of beamlets 214, 216, and 218 of primary electron beam 211, a primary projection optical system 220, a wafer stage (not shown in FIG. 3B), multiple secondary electron beams 236, 238, and 240, a secondary optical system 243, and electron detection device 244. Electron source 202 may generate primary particles, such as electrons of primary electron beam 211. A controller, image processing system, and the like may be coupled to electron detection device 244. Primary projection optical system 220 may comprise beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 100B. Secondary optical system 243 and electron detection device 244 may be aligned with a secondary optical axis 252 of apparatus 100B.

Electron source 202 may comprise a cathode, an extractor or an anode, wherein primary electrons can be emitted from the cathode and extracted or accelerated to form a primary electron beam 211 with a crossover (virtual or real) 208. Primary electron beam 211 can be visualized as being emitted from crossover 208. Gun aperture 204 may block off peripheral electrons of primary electron beam 211 to reduce size of probe spots 270, 272, and 274.

Source conversion unit 212 may comprise an array of image-forming elements (not shown in FIG. 3B) and an array of beam-limit apertures (not shown in FIG. 3B). An example of source conversion unit 212 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 211. The array of beam-limit apertures may limit the plurality of beamlets 214, 216, and 218.

Condenser lens 206 may focus primary electron beam 211. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be an adjustable condenser lens that may be configured so that the position of its first principle plane is movable. The adjustable condenser lens may be configured to be magnetic, which may result in off-axis beamlets 216 and 218 landing on the beamlet-limit apertures with rotation angles. The rotation angles change with the focusing power and the position of the first principal plane of the adjustable condenser lens. In some embodiments, the adjustable condenser lens may be an adjustable anti-rotation condenser lens, which involves an anti-rotation lens with a movable first principal plane. Adjustable condenser lens is further described in U.S. Publication No. 2017/0025241, which is incorporated by reference in its entirety.

Objective lens 228 may focus beamlets 214, 216, and 218 onto a wafer 230 for inspection and may form a plurality of probe spots 270, 272, and 274 on the surface of wafer 230.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 towards secondary optical system 243.

Deflection scanning unit 226 may deflect beamlets 214, 216, and 218 to scan probe spots 270, 272, and 274 over an area on a surface of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 243 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of the surface of wafer 230. Detection sub-regions 246, 248, and 250 may include separate detector packages. Each detection sub-region may include a single sensing element.

Figure 4A:
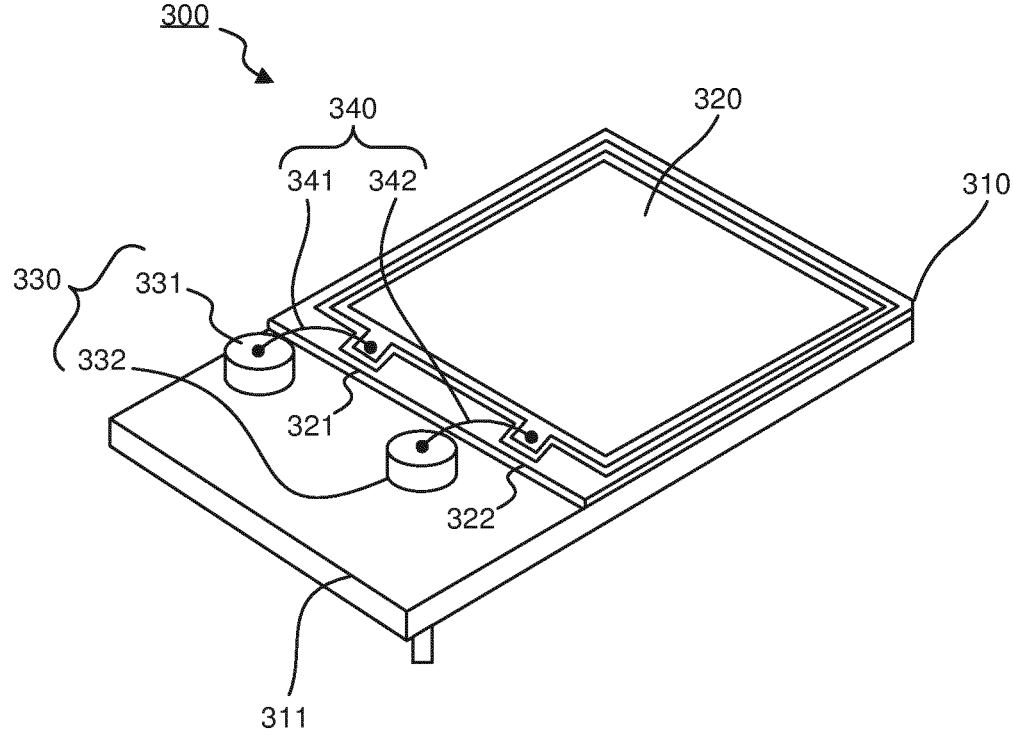
FIGS. 4A-4C illustrate an exemplary comparative detector package, consistent with embodiments of the present disclosure.
Figure 4B:
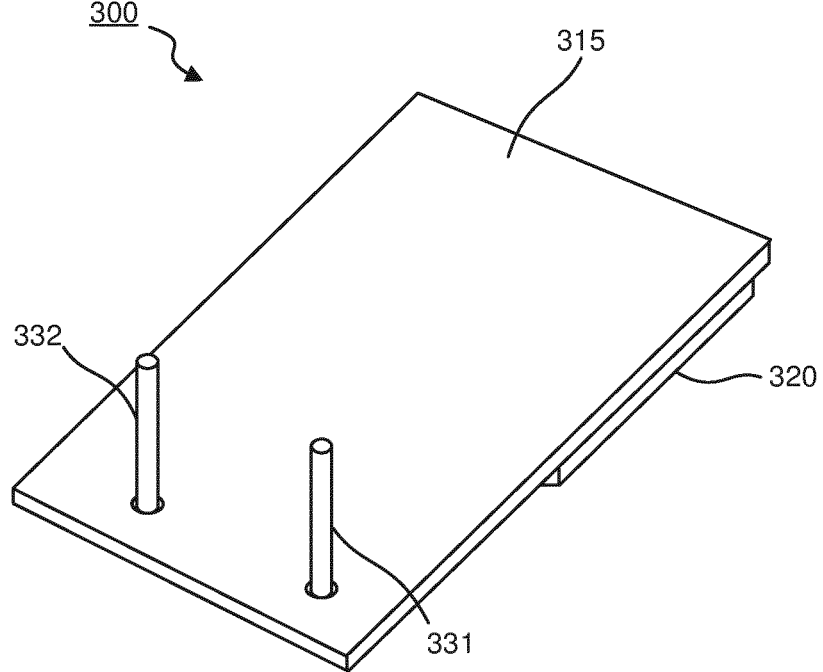
Figure 4C:
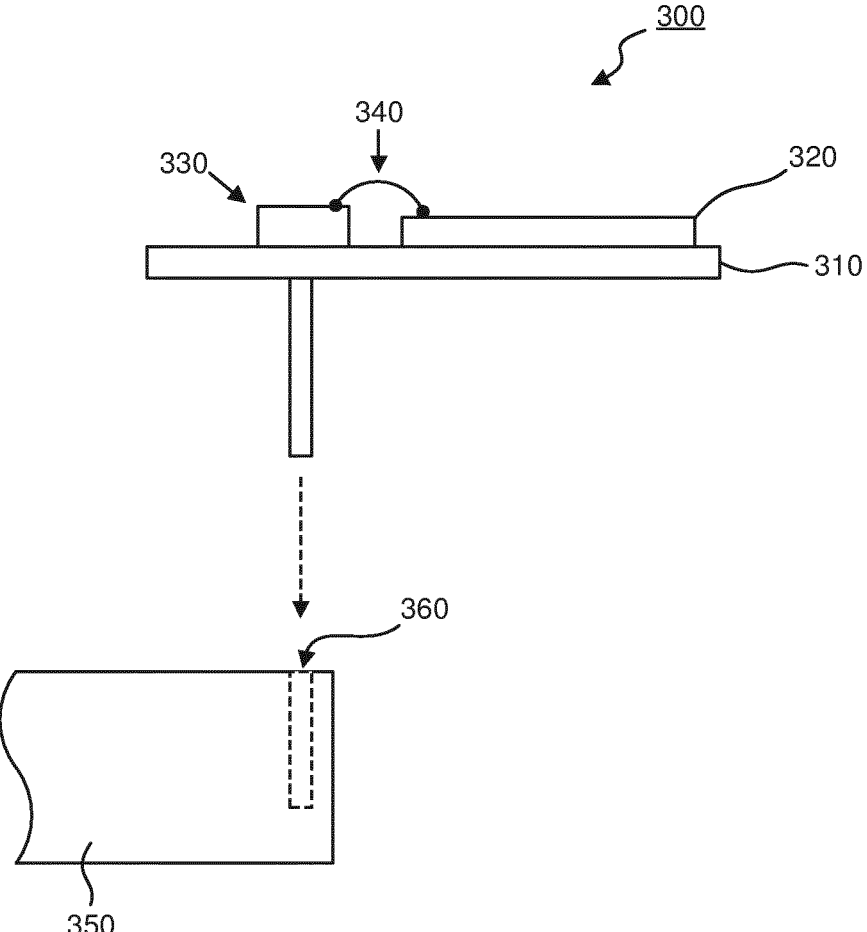
Figure 4E:
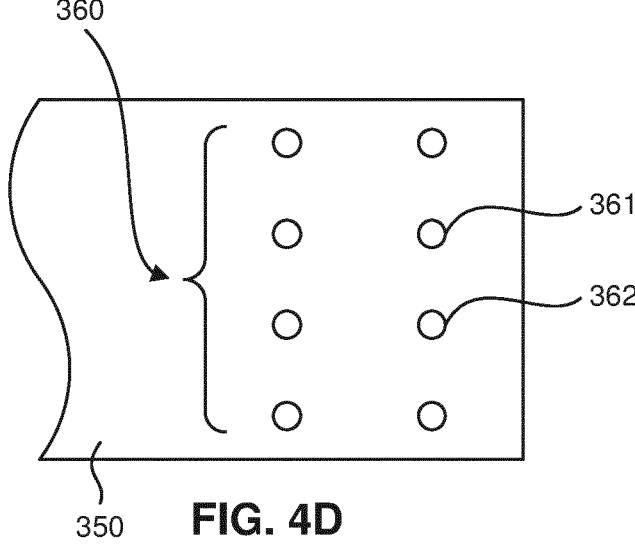
FIGS. 4E and 4F illustrate an exemplary pin, consistent with embodiments of the present disclosure.
Figure 4E:
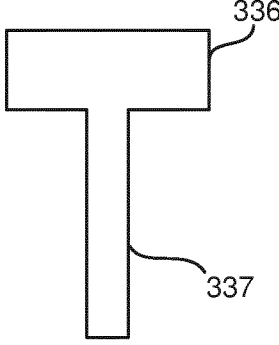

Reference is now made to FIGS. 4A-4F, which illustrate examples of a comparative detector package, consistent with embodiments of the present disclosure. FIG. 4A is a top perspective view of a detector package 300. Detector package 300 may include a base 310, a sensing element 320, pins 330, and bonding section 340. Pins 330 may include two pins, e.g., a first pin 331 and a second pin 332. Pins 330 may be provided as standardized components. For example, pins 330 may be readily available components that are manufactured to industry standards. An example of a pin is shown in FIG. 4E. The pin may include a head 336 and a shaft 337.

As shown in FIG. 4A, sensing element 320 may be provided on base 310. Sensing element 320 may include a semiconductor diode. The diode may be configured to transform incident energy (e.g., incident secondary electrons) into a measurable signal. In some embodiments, sensing element 320 may be integrated with base 310. In some embodiments, sensing element 320 may be provided on top of a top surface 311 of base 310. Sensing element 320 may be connected to pins 330 through bonding section 340. Sensing element 320 may include electrode portions including, for example, an anode connecting portion and a cathode connecting portion. The electrode portions may include bonding pads, e.g., a first pad 321 and a second pad 322. Bonding section 340 may include bonding wires 341 and 342. Bonding wire 341 may connect to first pad 321 of sensing element 320 at one and may connect to the head of first pin 331 at the other end. Bonding wire 342 may connect to second pad 322 of sensing element 320 at one and may connect to the head of second pin 332 at the other end. Bonding wires 341 and 342 may be connected to some components by soldering. Electrical signals generated in sensing element 320 may be transmitted through bonding section 340 and through pins 330 to be output to other components of a detection system. For example, analog or digital signal processing paths may be provided.

As shown in FIG. 4B, pins may extend through the detector package. Shafts of first pin 331 and second pin 332 are visible on the underside of detector package 300. Detector package 300 may include a bottom surface 315. Shafts of pins 330 may extend through detector package 300 by holes in base 310.

As shown in FIG. 4C, detector package 300 may connect to a module 350. Module 350 may include sockets 360. Sockets 360 may be configured to receive pins 330. Sockets 360 may include an electrically conductive portion. FIG. 4D is a top view of module 350. Sockets 360 may include a first socket 361 configured to connect with first pin 331 and a second socket 362 configured to connect with second pin 332. Multiple sockets may be provided in module 350. An arrangement of sockets 360 in module 350 may be set in advance. A distance between individual ones of sockets 360 may be predetermined. The distance may be set based on the dimensions of pins 330. For example, because a pin includes head 336 that may have a predetermined size, distance between sockets 360 may be set as a predetermined distance or more to accommodate pins being placed adjacent to one another. Module 350 may be adaptable so that detector package 300 may be inserted into any two adjacent ones of sockets 360.

Signals generated in detector package 300 may be routed into a signal processing path. The path that signals take may have an analog portion and a digital portion. For example, there may be a portion including wires that transfer a raw signal to another component (e.g., an analog portion). There may be another portion including semiconductor logic or other components where operations may take place (e.g., a digital portion). To enhance detector performance, it may be desirable for a detector package to be able to handle many signals being routed through the analog portion rapidly. For high speed imaging, it may be desirable to enhance bandwidth in the analog portion.

Figure 4F:
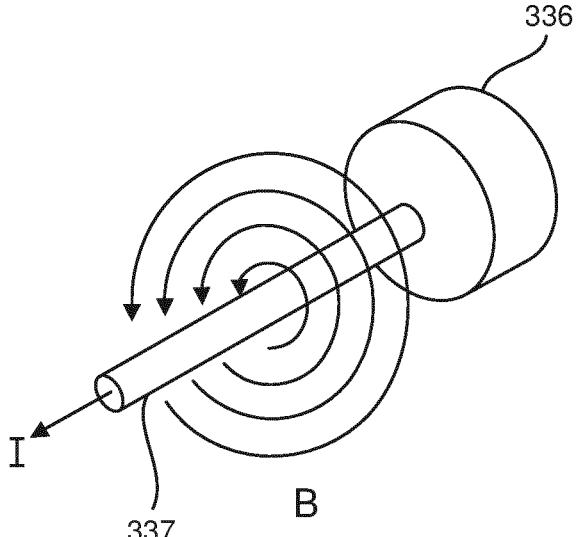

FIG. 4E is a side view of a pin having head 336 and shaft 337. Aspects of the pin may be predetermined, such as material, dimensions, etc. The pin may be an electrical conductor. The pin may be configured to transmit electrical signals (e.g., electrical current) therethrough. FIG. 4F illustrates an effect of current running through a pin. The pin may be connected to a circuit such that current is introduced through head 336 and flows through shaft 337. Current I may flow from head 336 toward an opposite end of the pin. A magnetic field B may be generated due to current I flowing through the pin. Magnetic field B may have a strength and direction. Magnetic field lines illustrated in FIG. 4F show the direction of magnetic field curling around shaft 337 in a counterclockwise manner, in accordance with the right-hand rule.

In operation, detector package 300 may receive incident charged particles and generate a signal in response. The signal may be an electrical signal, such as a current. The signal may be transmitted out of detector package 300 by pins 330. Detector package 300 may generate signals using sensing element 320. Sensing element 320 may include a large-active area sensing element.

In some embodiments, a single-beam SEM may include a single-sensing element detector. To guarantee high resolution, large FOV, and low distortion within the FOV of a primary charged particle beam, it may be important to achieve a high collection rate of secondary particles (e.g., secondary electrons). A large-active area sensing element may be useful to achieve high secondary electron collection rate. Additionally, to simplify electron optical designs (e.g., by omitting secondary optical system 243, as in FIG. 3B), it may be useful to employ a large-active area sensing element. A large-active area sensing element may compensate for possible increased dispersion of secondary particles landing on a detector. For example, without secondary optics, electrons arriving on the detector may land with a broader geometric spread.

In some embodiments, a multi-beam SEM may use a detector having multiple detection regions. Each of the detection regions may include a single-sensing-element detector. An array (e.g., a 3×3 array) of sensing elements may be provided. Each of the sensing elements may be configured to have a large active area.

A semiconductor detector may be useful to enhance signal-to-noise ratio (SNR) in a detection system as compared to, for example, an Everhart-Thornley detector (ETD), which may use a scintillator and a photomultiplier tube (PMT). A semiconductor detector may also be useful to achieve a large-active area sensing element. However, to improve the analog bandwidth of an image channel of a detector, various difficulties may be encountered when using a large-active area sensing element.

Some issues associated with a large-active area sensing element encountered when used in a semiconductor electron detector may include, for example:

1. Large active area of a sensing element may result in large parasitic capacitance.
2. Compatibility with existing components, such as pins, should be maintained.
3. To enhance high-speed operation, equivalent series resistance of a detector should be kept low. This may result in a high Q-factor, which may indicate low dampening and may result in self-resonance that could affect high-frequency operation.
4. A detector design including pins may have large parasitic inductance. Parasitic inductance may impede the use of higher frequency ranges for operation of the detector. This may impede high-speed operation.

Some of the above may be addressed by adjusting aspects of detector design. Others may not be readily addressed. For example, parasitic capacitance may be closely linked to the surface area of the active area of the detector (e.g., the area of a sensing element exposed to incident secondary electrons and that reacts to incident secondary electrons). If a design calls for a large-active-area detector, attempting to reduce parasitic capacitance by reducing the surface area of a sensing element may not be an option. Parasitic capacitance may complicate the design of a detector. Criteria for large-active-area may itself impose a design constraint on a detector, and, due to high parasitic capacitance, it may be difficult to design a detector for high analog bandwidth image channels.

Furthermore, compatibility with existing components may be significant for the following exemplary reasons. Existing packages may use pins for easy assembly and replacement. In the design of a detector, pins may not be easily substituted with another component. A SEM system may follow a predetermined servicing procedure. The use of pins may enhance convenience for following the servicing procedure. Pins may enable installation and replacement by an operator, while other connection mechanisms may be complicated and require a skilled technician for servicing.

However, using pins may contribute to parasitic parameters, such as parasitic inductance. Pins may be relatively large and may require being placed at a relatively large interval so as to prevent contacting one another (and may require a predetermined clearance). For example, because the heads of pins may be wide, the pins may need to be spaced apart by a relatively long distance so that adjacent heads have a clearance space between one another. Conductive paths between pins and other components may also be relatively long. Pins having large size and with long conductive paths may contribute to parasitic inductance.

As an alternative or in addition to a pin, a connecting structure may include bonding wires. Furthermore, traces (e.g., strips of conductive material patterned on a device) may be provided. Bonding wires and traces may be easily optimized. For example, a design of a circuit may be modified so that the length of bonding wires may be made short. Furthermore, multiple bonding wires may be provided in parallel for a single connection. This may reduce the amount of current flowing through each individual wire.

Parasitic parameters of bonding wires may be reduced with relatively little effort. For example, a system may be designed so as to minimize the length of bonding wires, or to arrange multiple wires in parallel, as discussed above. On the other hand, parasitic parameters of pins or traces may be relatively difficult to reduce. Reducing parasitic inductance of a pin may not be as straightforward as, for example, shortening the length of a bonding wire. The geometry of a pin may be set and cannot be varied.

In some embodiments, it may be useful to use some bonding wires in conjunction with pins. However, it may be necessary to maintain the use of some pins, and thus, the use of pins may not be eliminated entirely, for example, for the reasons of compatibility as noted above.

An electrical system, such as a detector, may have a property of self-resonance. For example, a detector may be configured to have low internal resistance to enable high-speed operation. The equivalent series resistance of the detector may be kept low. This may contribute to the detector having a high Q-factor. With a high Q-factor, oscillations within a detector may be relatively large. Furthermore, the system may have relatively low internal dampening (e.g., experiencing low energy loss) and oscillations may take a relatively long time to subside. Q-factor may relate to parasitic parameters. In particular, high parasitic inductance may contribute to high Q-factor. When Q-factor is high, a system may have a high degree of self-resonance. A detector with high self-resonance may exhibit irregular response at certain frequency ranges. For example, a detector may exhibit a predictable response in a certain range in which self-resonance does not occur. However, the detector may exhibit a different response at resonant frequencies outside the certain range. Regions of irregular response may inhibit the potential use of a detector in a wider range of operating frequencies. Self-resonance may cause an irregular response in a high-frequency region, and thus, the usefulness of the upper frequency range of a detector may be limited. To enhance detector performance at broad frequency ranges, for example including an upper frequency range where it may be desirable to operate a detector for high-speed image channel operation, it may be useful to reduce or eliminate the self-resonance property of the detector. Parasitic inductance may contribute to self-resonance, and thus it may be useful to reduce parasitic inductance in a detector to enhance detector performance.

Self-resonance may refer to a phenomenon where a system may resonate. There may be a region of frequencies where self-resonance may be likely to occur. A detector with a large active area may have a relatively low frequency at which self-resonance may start to occur. Self-resonance properties may be dependent on specific dimensions of components of a detector, for example, a measure of active area. A detector having an active area greater than or equal to a first area (e.g., 100 mm2) may have self-resonance at frequencies of less than or equal to a first frequency (e.g., 300 MHz). The first frequency may be included in a region where it would be desirable to operate the detector for high speed image channel operation. However, due to self-resonance, the detector may exhibit non-constant group delay in the frequency range corresponding to high-speed image channel operation.

In some embodiments, pins may be added and may be connected to terminals of a detector in parallel. Using multiple pins connected in parallel may reduce parasitic inductance to an extent. For example, the current running through each pin may be reduced. However, this may still leave improvements to be desired in enhancing performance of the detector. Furthermore, as analog bandwidth increases, it may become more and more difficult to design a detector with reduced parasitic inductance such that high-speed image channel operation is enabled.

In some embodiments, a detector package may include two pins for each detection cell. A detection cell may include a single contiguous region of active area in which charged particles may be received. The detection cell may include a sensing element. In some embodiments, a detector may include multiple detection cells. Each of the detection cells may be configured to receive a beam spot of a different secondary beam. In some embodiments, the same beam spot may cover more than one detection cell. A detector including multiple detection cells may refer to the active areas of each of the separate detection cells as sub-areas.

As discussed above, FIG. 4A shows detector package 300 that includes one sensing element 320 and two pins 330. Detector package 300 may be configured so that signal current is generated in response to secondary electrons being received on sensing element 320. The signal current may be configured to flow through pins 330. For example, when secondary electrons are received at sensing element 320, current may be generated and may flow out through first pad 321 and through first pin 331. First pin 331 may be connected to an analog signal processing path. Current may also flow in the opposite direction through pin 332. Magnetic field may be generated as current flows through pins 330. The magnetic field may relate to the parasitic inductance in detector package 300.

Figure 5A:
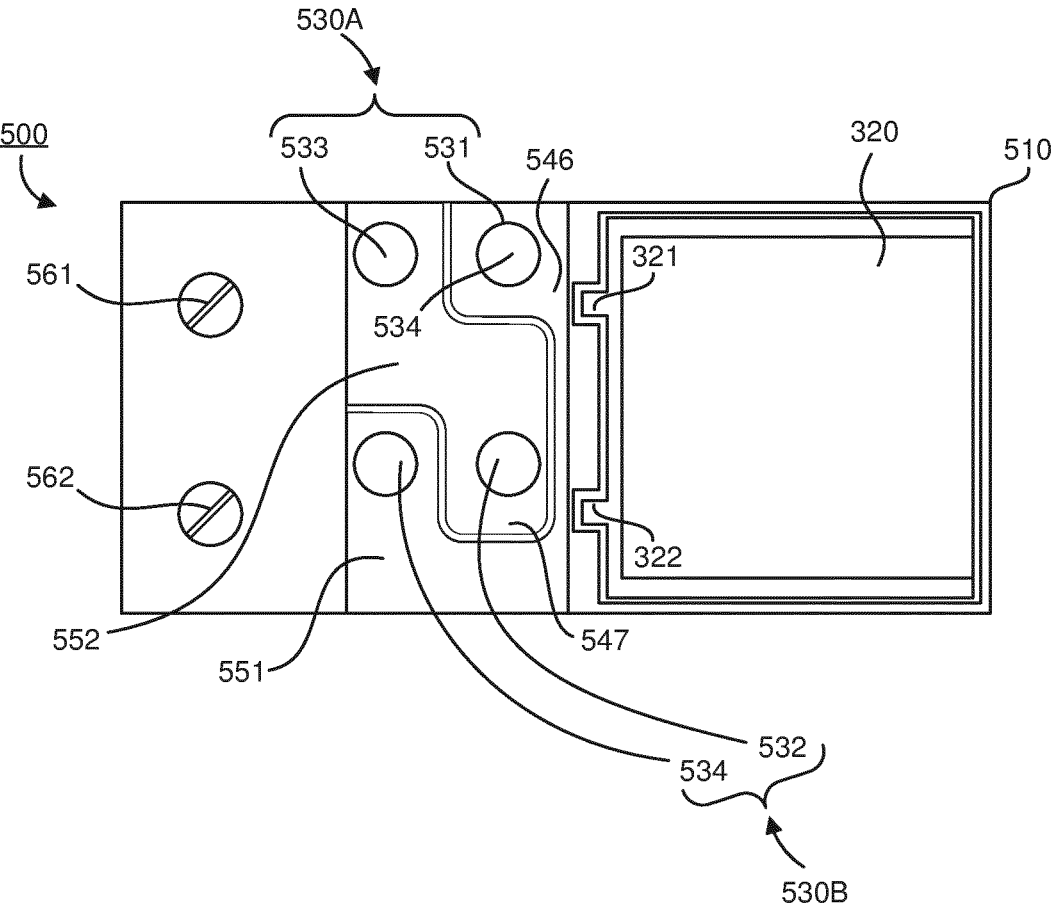
FIGS. 5A-5D illustrate an exemplary detector package, consistent with embodiments of the present disclosure.

FIG. 5A shows a detector package 500 having multiple pins, consistent with embodiments of the present disclosure. Like detector package 300, detector package 500 may include a base 510 with a top surface 511. Base 510 may include a ceramic material. Base 510 may include a substrate. Detector package 500 may include sensing element 320 on top surface 511. However, different from detector package 300, detector package 500 may be configured to connect to a plurality of groups of pins. There may be provided a first group of pins 530A and a second group of pins 530B. Each of the first and second groups may include a plurality of pins. First group 530A may include pins 531 and 533. Second group 530B may include pins 532 and 534.

Sensing element 320 may be connected to all of pins 531, 532, 533, and 534. Pins 532 and 533 may be configured to be connected to an anode. Pins 531 and 534 may be configured to be connected to a cathode. Pins 531, 532, 533, and 534 may be connected to a module, such as by sockets 360 of module 350 (see FIG. 4D). Sensing element 320 may be configured so that separate terminals are connected to separate sets of pins among first group 530A and second group 530B. A "set" may refer to a collection of pins that are electrically connected to one another. A "group" may refer to a collection of pins that are located near one another. Pins of a group may be disposed near a terminal of a sensing element, or near a point where a connection is made to a terminal. Connections may be made through bonding pads (e.g., first pad 321 and second pad 322). Connections may be made by bonding wires (not shown in FIG. 5A). The pins of first group 530A may be arranged to be adjacent to first pad 321. The pins of second group 530B may be arranged to be adjacent to second pad 322. The pins of first group 530A may be aligned with first pad 321 (e.g., in a horizontal direction in the view of FIG. 5A). The pins of second group 530B may be aligned with second pad 322 (e.g., in the horizontal direction in the view of FIG. 5A).

Pins of different groups may be connected to one another. For example, as shown in FIG. 5A, pin 531 and pin 534 may be connected by trace 551. Trace 551 may include a conductive material. For example, trace 551 may include a copper layer deposited on top surface 511 of base 510. Furthermore, pin 532 and pin 533 may be connected through trace 552. Traces 551 and 552 may be separated from one another. In some embodiments, traces 551 and 552 may include a conductive line. Dimensions of the conductive line (e.g., width and height of the material making up the conductive line) may be adjusted so as to adjust impedance. For example, trace 552 may make use of a relatively large proportion of the surface area of top surface 511 between pin 532 and pin 533 so as to minimize impedance.

Electrically connected pins may form a set. For example, as shown in FIG. 5E, a first set of pins 530X may include pin 531 and pin 534. A second set of pins 530Y may include pin 532 and pin 533. As shown in FIG. 5A, connections between pins of respective sets may be made through traces such as trace 551 that may connect pin 531 and pin 534, and trace 552 that may connect pin 532 and pin 533. Connections may also be made through traces on a bottom surface of base 510 (see FIG. 5D).

Figure 6:
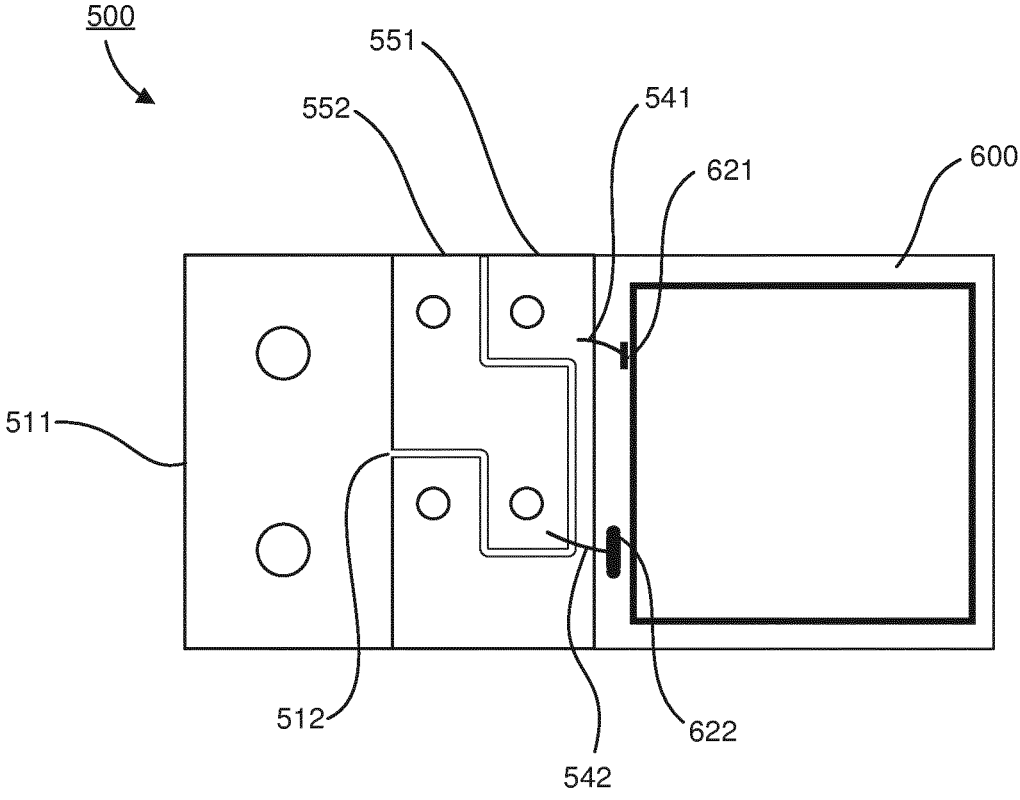
FIG. 6 illustrates an exemplary detector package and an exemplary connection arrangement, consistent with embodiments of the present disclosure.

Connections from sensing element 320 to pills 531, 532, 533, and 534 may be made through bonding wire landing sites. FIG. 5A shows a first bonding wire landing pad 546 and a second bonding wire landing pad 547. Bonding wires may attach to trace 551 and trace 552 at portions not covered by pins. The portions not covered by pins may form an open space for receiving a bonding wire. For example, FIG. 6 shows a bonding wire 541 connected to trace 551 and a bonding wire 542 connected to trace 552. Traces 551 and 552 may be configured to provide bonding wire landing sites at areas close to a sensing element terminal, such as first pad 321 or second pad 322. In some embodiments, first bonding wire landing pad 546 may be aligned with first pad 321 (e.g., in the horizontal direction in the view of FIG. 5A). Second bonding wire landing pad 547 may be aligned with second pad 322 (e.g., in the horizontal direction in the view of FIG. 5A). A length of bonding wires may be minimized.

The pins of first group 530A may be disposed in close proximity to one another. The pins of first group 530A may be disposed in close proximity to a connecting point between an electrode and the pins. The electrode may include a terminal of a sensing element. For example, pins 531 and 533 may be in a region near first bonding wire landing pad 546. Similarly, the pins of second group 530B may be disposed in close proximity to one another. The pins of second group 530B may be disposed in close proximity to a connecting point between an electrode and the pins. For example, pins 532 and 534 may be in a region near second bonding wire landing pad 547. Pins may be configured to be distanced from one another with no less than a predetermined amount of space. The predetermined amount of space may correspond to a predetermined interval. The predetermined interval may account for a diameter of head 336 of a pin plus a clearance distance. Pins in close proximity to one another may be located, for example, such that they are separated with no more than one diameter of a head of a pin of space between them.

Detector package 500 may be configured so that current is enabled to flow in predetermined directions among pins 531, 532, 533, and 534. In operation, when sensing element 320 is connected to pins 531, 532, 533, and 534 via traces 551 and 552, current may flow in opposite directions within the same group of pins. Current may flow in the same direction among pins of the same set. For example, pins 531 and 534 may be connected to a cathode, and pins 532 and 533 may be connected to an anode. In first group 530A, current may flow in a first direction through pin 531, and current may flow in an opposite direction through pin 533. Furthermore, current may flow in the same direction among pins of different groups. For example, pin 533 of first group 530A may flow in the same direction as that of pin 532 of second group 530B. Pin 533 and pin 532 may be in the same set.

Detector package 500 may be configured so that pins are arranged with a symmetry. The symmetry may be such that magnetic field generated by pins is reduced or canceled out. A magnetic field generated by an individual pin may reduce or cancel out a magnetic field generated by a neighboring pin or group of pins. A magnetic field generated by all of the pills may be reduced or canceled out overall. As shown in FIG. 5A, pins 531, 532, 533, and 534 are arranged in a 2×2 grid. The pins may have rotation symmetry about an axis at the center of the 2×2 grid. Symmetry may be based on which of the pins is connected to either an anode or cathode. For example, the position of an anode-connected (e.g., pin 533) may be rotated 180 degrees about the axis and arrive at the position of another anode-connected (e.g., pin 532). At the axis in the center of the 2×2 grid, there may be a region where the magnetic field generated from the pins is reduced or canceled out. Reduction of magnetic field may refer to an effect that a magnetic field generated by current flow through one pin reduces a magnetic field generated by current flow through another pin.

In some embodiments, symmetry of pins may be expressed in terms of sets of pins. Sets of pins may include pins that are connected to the same terminal. The terminal may refer to one of either the cathode or anode of the detection system. Pins of one set may each be connected to one terminal of a sensing element. For example, a first set of pins may include pin 531 and pin 534. A second set of pins may include pin 532 and pin 533. The sets of pins may be symmetric to each other. In the arrangement of FIG. 5A (see also FIG. 5E), the sets of pins may form an X shape. The sets of pins may have rotation symmetry about an axis at the center of the X shape.

Pins may be arranged alternately. As shown in FIG. 5A, pins in first group 530A are arranged with a first order (e.g., anode-connected pin 533, cathode-connected pin 531), and pins in second group 530B are arranged with a second order that is alternate from the first order (e.g., cathode-connected pin 534, anode-connected pin 532). In adjacent groups of pins, the positions of pins connected to the anode and cathode may be switched. For example, in first group 530A, the position of anode-connected pins (e.g., pin 533) and cathode-connected pins (e.g., pin 531) may be reversed in comparison to that of second group 530B. The position may refer to the pin being on a terminal side or a distal side. For example, pin 531 may be adjacent first pad 321 (e.g., terminal side). Pin 533 may be distal from first pad 321 (e.g., distal side).

Each of the pins within a group of pins may be arranged close to a bonding wire landing pad on the detector package. As shown in FIG. 5A, pin 531 and pin 533 of first group 530A may be arranged close to first bonding wire landing pad 546. In some embodiments, first bonding wire landing pad 546 may be arranged between pin 531 and pin 533. Also, as shown in FIG. 5A, pin 532 and pin 534 of second group 530B may be arranged close to second bonding wire landing pad 547. In some embodiments, second bonding wire landing pad 547 may be arranged between pin 532 and pin 534. Furthermore, each bonding wire landing pad may be arranged close to a corresponding bonding pad of a die to which bonding wires connect. For example, first bonding wire landing pad 546 may be arranged close to first pad 321 of sensing element 320, and second bonding wire landing pad 547 may be arranged close to second pad 322 of sensing element 320.

Detector package symmetry may be such that magnetic field generated in the detector package is reduced or canceled out. Magnetic field may be generated by detector signal current that may flow through bonding wires, traces, and pins, etc. A detector package having symmetry may cause magnetic field generated within and around the detector package to be minimized or reduced to zero (or nearly zero). In this manner, parasitic inductance in the detector package may be reduced.

For example, FIG. 5E shows an arrangement of first set of pins 530X and second set of pins 530Y. First set 530X may include pin 531 and pin 534. The pins of first set 530X may be connected to a cathode. The pins of first set 530X may be connected to each other by trace 551 (not shown in FIG. 5E). The pins of first set 530X may be connected to a first terminal of a sensing element. Second set 530Y may include pin 532 and pin 533. The pins of second set 530Y may be connected to an anode. The pins of second set 530Y may be connected to each other by trace 552 (not shown in FIG. 5E). The pins of second set 530Y may be connected to a second terminal of a sensing element. There may be a symmetry between first set 530X and second set 530Y. For example, first and second sets 530X, 530Y may be rotationally symmetric about axis 535.

FIG. 5E shows magnetic fields that may be generated by current flowing through pins 531, 532, 533, and 534. Current may be configured to flow through pills of first set 530X in the same direction. Current may be configured to flow through pins of second set 530Y in the same direction, which may be opposite to that of first set 530X. Magnetic field generated around pin 531 may have a strength and direction. The strength may be related to the amount of current flowing through pin 531. The direction may be related to the direction of current flow. In the example of FIG. 5E, magnetic field generated by pin 531 curls around pin 531 in a clockwise direction. Similarly, magnetic field generated by pin 534 curls around pin 534 in a clockwise direction.

The pins of second set 530Y may generate magnetic field in a direction different from that of the pins of first set 530X. In the example of FIG. 5E, magnetic field generated by pin 533 curls around pin 533 in a counterclockwise direction. Similarly, magnetic field generated by pin 532 curls around pin 532 in a counterclockwise direction. Magnetic fields generated by pins of a set may cancel out with each other in some areas. In a region around axis 535, magnetic fields generated by all of pins 531, 532, 533, and 534 may cancel out. Furthermore, strength of magnetic fields generated by respective pins of a group may be balanced because pins of one group may be connected in parallel to one of the cathode or anode, and thus, the amount of current flowing through each pin may be substantially equal.

FIG. 5A further shows detector package 500 having first mounting fastener 561 and second mounting fastener 562. First and second mounting fasteners 561, 562 may include screws. First and second mounting fasteners 561, 562 may be used to secure detector package 500 to another structure mechanically, while pins 531, 532, 533, and 534 may be used to electrically connect detector package 500 to another component.

Figure 5B:
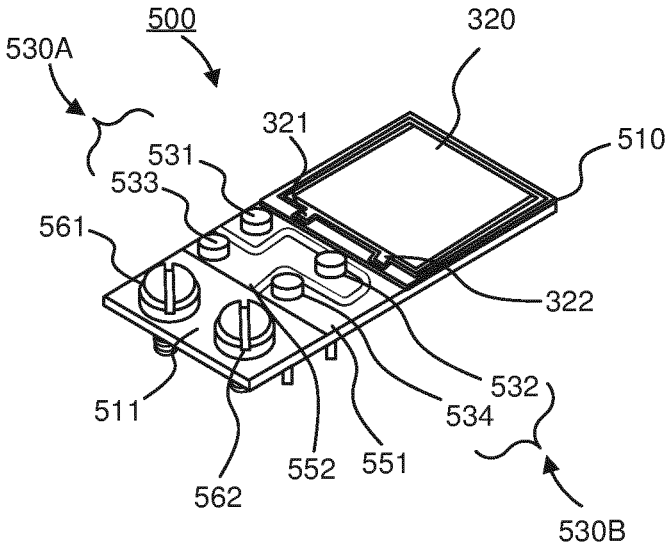
Figure 5C:
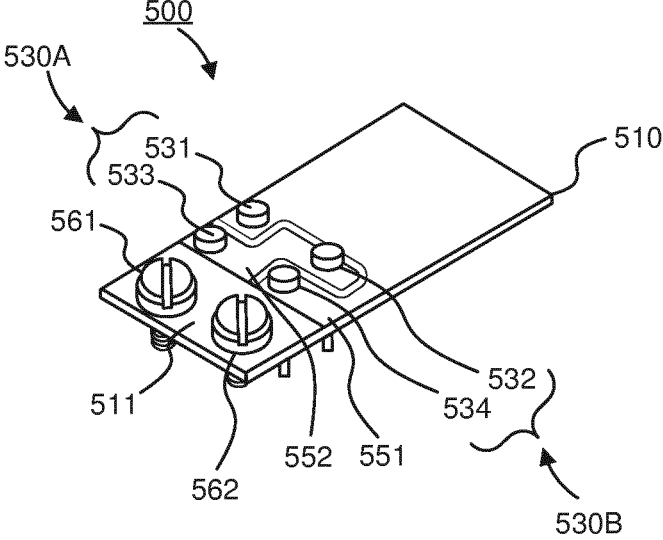
Figure 5D:
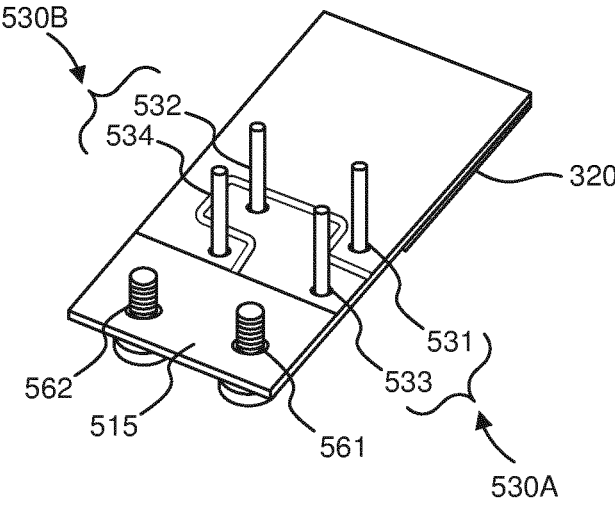
Figure 5E:
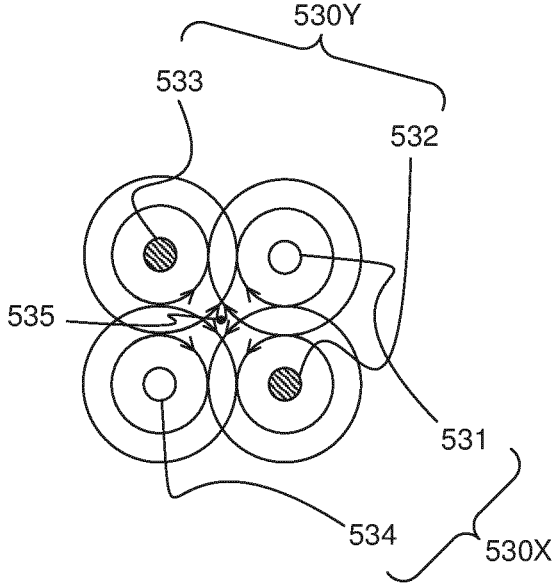
FIG. 5E shows magnetic fields around pins, consistent with embodiments of the present disclosure.

FIG. 5B shows a top perspective view of detector package 500. FIG. 5C shows a top perspective view of detector package 500 without sensing element 320 placed thereon. FIG. 5D shows a bottom perspective view of detector package 500. Base 510 of detector package 500 may have top surface 511 and a bottom surface 515. In some embodiments, bottom surface 515 may include a conductive layer. In some embodiments, conductive material of trace 551 or trace 552 may extend through base 510 and may be exposed to bottom surface 515. Traces 551 or 552 may be made to have a relatively large thickness so as to reduce impedance. In some embodiments, base 510 may be made integral with traces 551 or 552. In some embodiments, a trace on bottom surface 515 may be a mirror image of the trace on top surface 511. Traces on top surface 511 may be connected to traces on bottom surface 515.

Figures 9A, 9B:
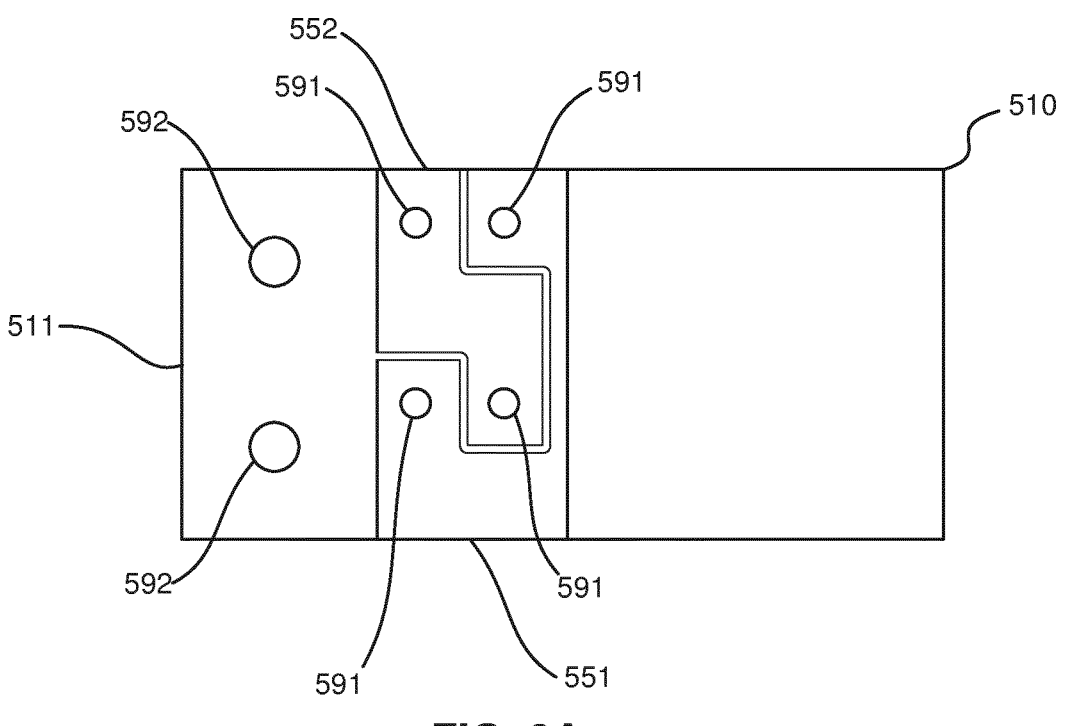
FIG. 9A illustrates a top surface of an exemplary detector package, consistent with embodiments of the present disclosure.
FIG. 9B illustrates a bottom surface of an exemplary detector package, consistent with embodiments of the present disclosure.

Reference is now made to FIG. 6, which illustrates an exemplary connection arrangement, consistent with embodiments of the present disclosure. FIG. 6 shows detector package 500 having a sensing element 600 rather than sensing element 320. Sensing element 600 includes a first pad 621 and a second pad 622. Sensing element 600 is connected to traces 551 and 552 by bonding wires. For example, first pad 621 is connected to trace 551 by bonding wire 541 and second pad 622 is connected to trace 552 by bonding wire 542. Traces 551 and 552 may be connected to pins (not shown in FIG. 6). For example, pins 531, 532, 533, and 534 may be inserted through holes in detector package 500 and may electrically connect to respective traces 551 and 552. A bottom surface of head 336 (see FIG. 4E) of a pin may connect to the top surface of respective traces 551 and 552. FIG. 9A and FIG. 9B show base 510 having holes 591 formed therein configured to accommodate pins, and holes 592 configured to accommodate mounting fasteners. As shown in FIG. 6, traces 551 and 552 may be separated from one another by a serpentine region 512. Serpentine region 512 may be an area where no conductive material is formed. Serpentine region 512 may include an insulator. Serpentine region 512 may be formed by a space. A width of serpentine region 512 may be set to greater than or equal to a predetermined value.

Figure 7:
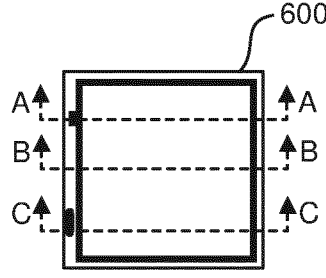
FIG. 7 illustrates an exemplary sensing element, consistent with embodiments of the present disclosure.
Figure 8A:
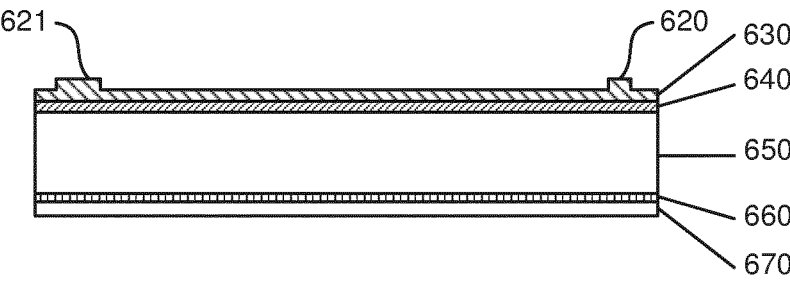
FIGS. 8A-8C are cross-sectional views of the sensing element of FIG. 7, consistent with embodiments of the present disclosure.
Figure 8B:
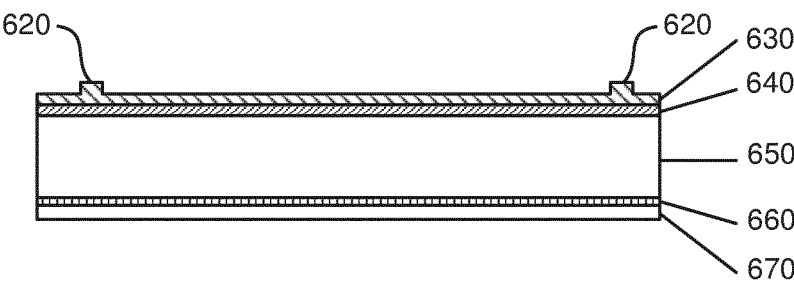
Figure 8C:
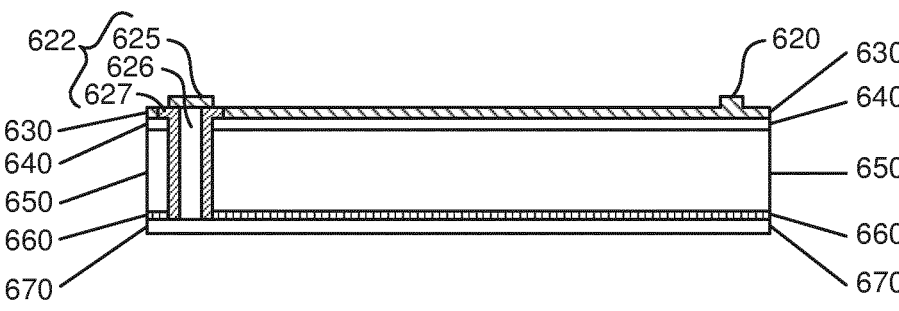

FIG. 7 shows sensing element 600 alone. FIG. 8A shows a cross-sectional view of sensing element 600 at the position of line A-A as shown in FIG. 7. FIG. 8B shows a cross-sectional view of sensing element 600 at the position of line B-B as shown in FIG. 7. FIG. 8C shows a cross-sectional view of sensing element 600 at the position of line C-C as shown in FIG. 7.

As shown in FIG. 8A, sensing element 600 may include a conducting ring 620 around a periphery of sensing element 600. Conducting ring 620 may include first pad 621. Conducting ring 620 may be formed by a conductive material and may have an increased thickness relative to another surface covering of sensing element 600. For example, sensing element 600 may include layer 630. Layer 630 may be formed of a conductive material, such as aluminum. Layer 630 may be of relatively low density and low thickness so as not to interfere with incident secondary electrons landing on sensing element 600. Conducting ring 620 may be formed of the same material as that of layer 630. Layer 630 may be configured to collect and transmit signal current generated in sensing element 600 to another component. Signal current generated in sensing element 600 may be transmitted through layer 630 to conducting ring 620 and out of sensing element 600 via first pad 621.

Sensing element 600 may include a semiconductor diode. Sensing element 600 may be formed with a plurality of layers. Sensing element 600 may be configured to form a depletion region when a reverse bias is applied. Sensing element 600 may include a first region of highly doped semiconductor material. For example, sensing element 600 may include a P++ layer 640. Sensing element 600 may include an intrinsic region. For example, sensing element 600 may include an N-layer 650. Sensing element 600 may include a second highly doped semiconductor material having a conductivity different from that of the first region. For example, sensing element 600 may include an N++ region 660. Sensing element 600 may include a conducting layer on a bottom side thereof. For example, sensing element 600 may include a metal layer 670. Metal layer 670 may be formed of aluminum.

As shown in FIG. 8A, first pad 621 may include a region of increased width relative to other parts of conducting ring 620. As shown in FIG. 8B, width of conducting ring 620 may be uniform at other parts of sensing element 600.

As shown in FIG. 8C, sensing element 600 may include second pad 622. Second pad 622 may include a bonding pad region 625, a through via 626, and an insulator 627. Bonding pad region 625 may be formed of aluminum. Through via 626 may be formed of a conductive material. Through via 626 may be configured to electrically connect bonding pad region 625 to metal layer 670. Insulator 627 may be configured to electrically insulate second pad 622 from layer 630, P++ region 640, N– region 650, and N++ region 660.

In operation, sensing element 600 may be exposed to incident charged particles. Incident charged particles may interact with a depletion region formed in sensing element 600 when bias is applied (e.g., reverse bias), and may generate charges. Charges generated in response to incidence of charged particles on sensing element 600 may flow toward a terminal of sensing element 600 and may be transmitted out of sensing element 600.

FIG. 9A shows a top view of base 510 of detector package 500. Sensing element 600 may be placed on top surface 511 of base 510. Metal layer 670 (shown in FIGS. 8A-8C) of sensing element 600 may be electrically connected to a trace formed on top surface 511 of base 510. For example, in some embodiments, trace 551 may be formed covering a region of top surface 511 of base 510 where a sensing element may be placed (see FIG. 14A).

FIG. 9B shows a bottom view of base 510 of detector package 500. Bottom surface 512 of base 510 may be a side of detector package 500 opposite from where sensing element 600 is placed. Traces may be formed on bottom surface 512 of base 510. For example, as shown in FIG. 9B, there may be a first trace 553 and a second trance 554 provided on bottom surface 512 of base 510. Trace 553 may be connected to trace 552. Trace 553 may connect the pins of one set (e.g., pins 532 and 533). Trace 554 may be connected to trace 551. Trace 554 may connect the pins of one set (e.g., pins 531 and 534). Traces on respective top and bottom surfaces of base 510 may be connected through pins inserted through holes 591.

Figure 10:
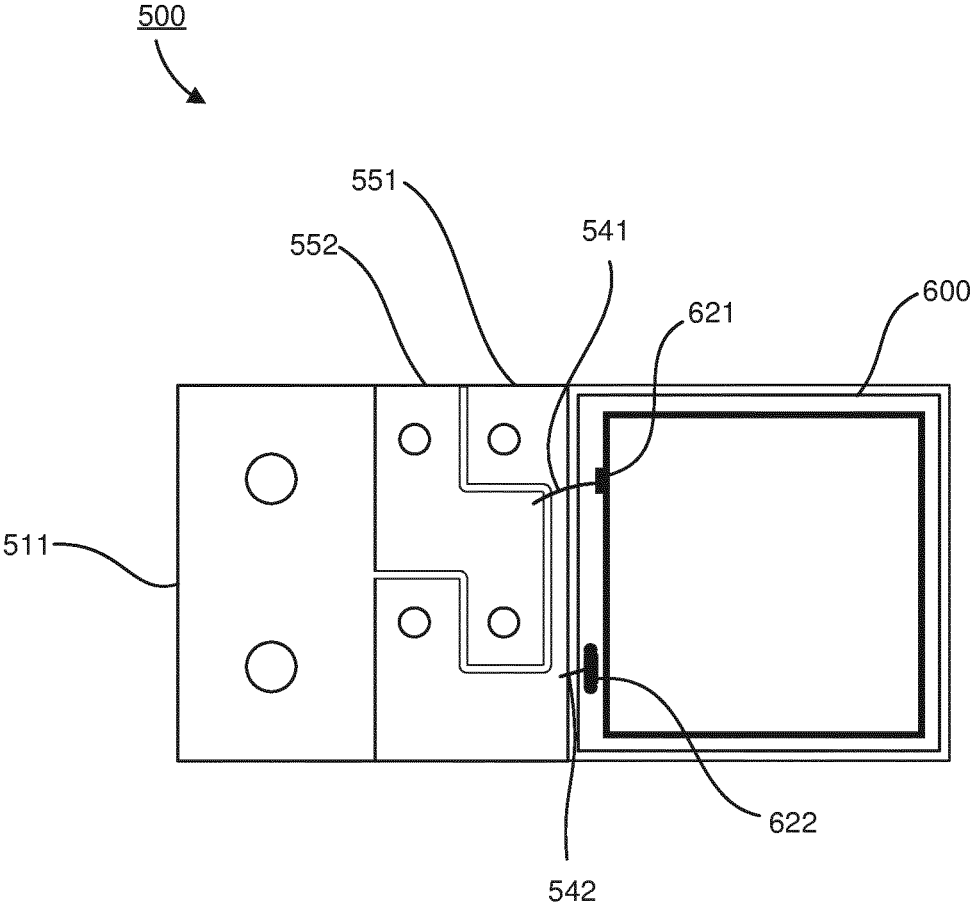
FIG. 10 illustrates an exemplary detector package and an exemplary connection arrangement, consistent with embodiments of the present disclosure.

Reference is now made to FIG. 10, which illustrates an exemplary connection arrangement, consistent with embodiments of the present disclosure. Similar to FIG. 6, the example of FIG. 10 shows detector package 500 having a sensing element 600. However, different from FIG. 6, in FIG. 10, sensing element 600 may be connected to different ones of traces 551 and 552. FIG. 10 shows first pad 621 of sensing element 600 connected by bonding wire 541 to trace 552. Also, second pad 622 is connected by bonding wire 542 to trace 551. Detector package 500 of FIG. 10 may be similar to that of FIG. 6 except that different pins are connected to cathode and anode terminals. For example, in FIG. 10, pins connected to trace 551 may be connected to an anode while pins connected to trace 552 may be connected to a cathode.

Figure 11:
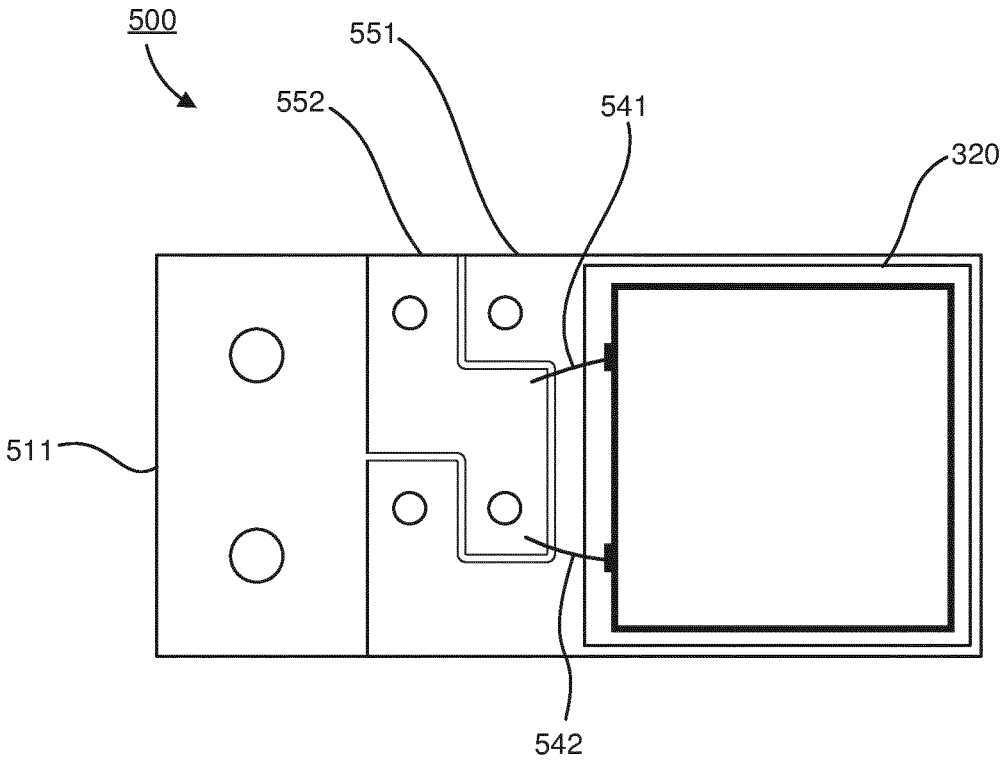
FIG. 11 illustrates an exemplary detector package and an exemplary connection arrangement, consistent with embodiments of the present disclosure.

Reference is now made to FIG. 11, which illustrates an exemplary connection arrangement, consistent with embodiments of the present disclosure. FIG. 11 shows detector package 500 having sensing element 320 connected to trace 552 by bonding wires. Meanwhile, trace 551 may be connected to sensing element 320 by direct contact with the bottom surface of sensing element 320. Sensing element 320 may be connected to trace 552 by two bonding wires (e.g., first bonding wire 541 and second bonding wire 542). The amount of current flowing through individual bonding wires may be reduced relative to a case where single bonding wires connect respective terminals of a sensing element to traces on a detector package.

Figure 12:
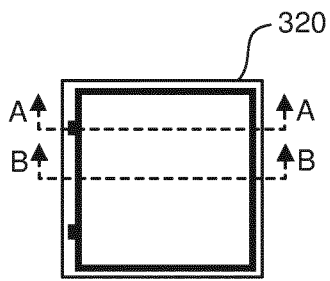
FIG. 12 illustrates an exemplary sensing element, consistent with embodiments of the present disclosure.
Figure 13A:
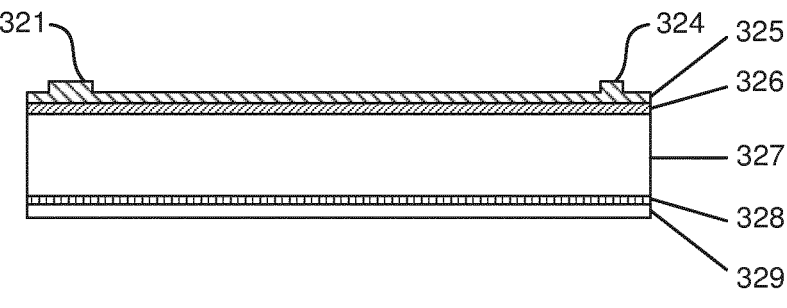
FIGS. 13A and 13B are cross-sectional views of the sensing element of FIG. 12, consistent with embodiments of the present disclosure.
Figure 13B:
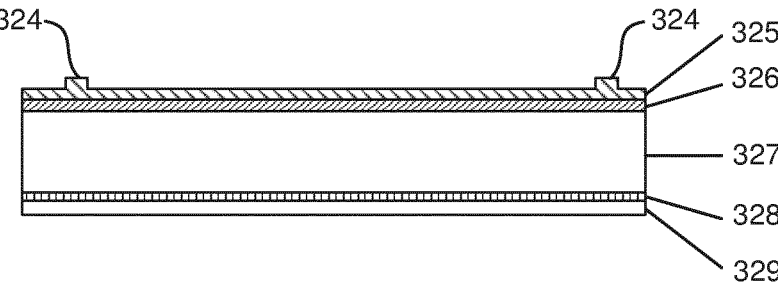

FIG. 12 shows sensing element 320 alone. FIG. 13A shows a cross-sectional view of sensing element 320 at the position of line A-A as shown in FIG. 12. FIG. 13B shows a cross-sectional view of sensing element 320 at the position of line B-B as shown in FIG. 12.

As shown in FIG. 13A, sensing element 320 may include a conducting ring 324 around a periphery of sensing element 320. Conducting ring 324 may include first pad 321 and second pad 322. Conducting ring 324 may be similar to conducting ring 620 discussed above with reference to FIGS. 8A-8C.

Sensing element 320 may include layer 325. Layer 325 may be formed of a conductive material, such as aluminum. Layer 325 may be of relatively low density and low thickness so as not to interfere with incident secondary electrons landing on sensing element 320. Conducting ring 324 may be formed of the same material as that of layer 325. Layer 325 may be configured to collect and transmit signal current generated in sensing element 320 to another component. Signal current generated in sensing element 320 may be transmitted through layer 325 to conducting ring 324 and out of sensing element 320 via first pad 321 or second pad 322.

Sensing element 320 may include a semiconductor diode, similar to sensing element 600. Sensing element 320 may differ from sensing element 600 in that sensing element 320 may omit a through-via structure. Ease of manufacturing of sensing element 320 may be enhanced. For example, a process of manufacturing sensing element 320 may include fewer steps than that of sensing element 600.

Sensing element 320 may be configured to form a depletion region when a reverse bias is applied. Sensing element 320 may include a first region of highly doped semiconductor material. For example, as shown in FIG. 13A, sensing element 320 may include a P++ layer 326. Sensing element 320 may include an intrinsic region. For example, sensing element 320 may include an N− layer 327. Sensing element 320 may include a second highly doped semiconductor material having a conductivity different from that of the first region. For example, sensing element 320 may include an N++ region 328. Sensing element 320 may include a conducting layer on a bottom side thereof. For example, sensing element 320 may include a metal layer 329. Metal layer 329 may be formed of aluminum.

As shown in FIG. 13A, first pad 321 may include a region of increased width relative to other parts of conducting ring 324. As shown in FIG. 13B, width of conducting ring 324 may be uniform at other parts of sensing element 320. Second pad 322 may be formed similar to first pad 321.

Figure 14A:
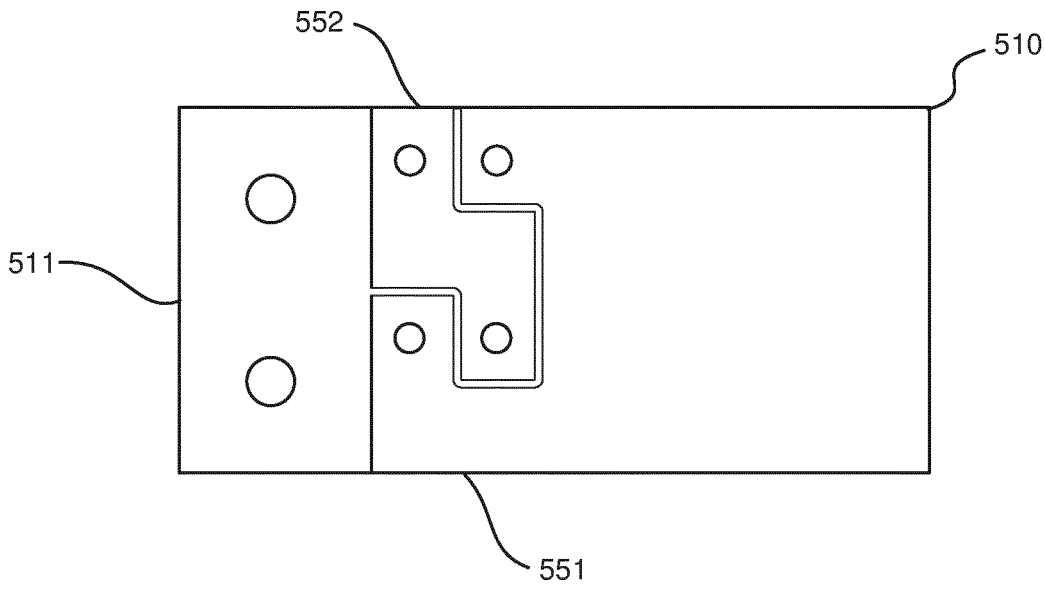
FIG. 14A illustrates a top surface of an exemplary detector package, consistent with embodiments of the present disclosure.
Figure 14B:
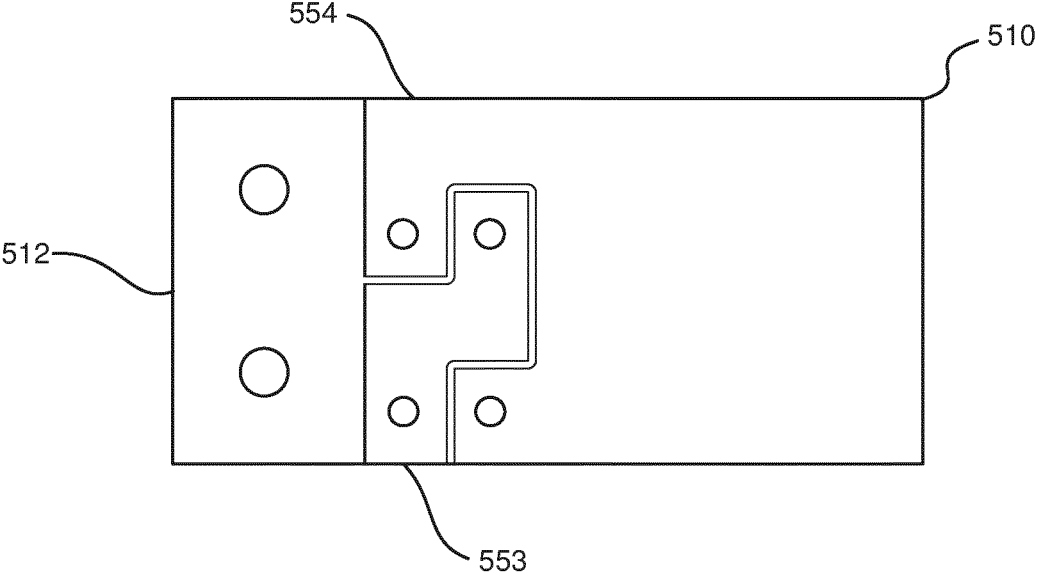
FIG. 14B illustrates a bottom surface of an exemplary detector package, consistent with embodiments of the present disclosure.

FIG. 14A shows a top view of base 510 of detector package 500. A sensing element (e.g., sensing element 320) may be placed on top surface 511 of base 510. Metal layer 329 (as shown in FIGS. 13A-13B) of sensing element 320 may be electrically connected to a trace formed on top surface 511 of base 510. For example, trace 551 may be formed on a region of top surface 511 of base 510 where sensing element 320 may be placed. FIG. 14B shows a bottom view of base 510 of detector package 500. First trace 553 and a second trance 554 may be provided on bottom surface 512 of base 510. Trace 553 may be connected to trace 552. Trace 553 may connect the pins of one set (e.g., pins 532 and 533). Trace 554 may be connected to trace 551. Trace 554 may connect the pins of one set (e.g., pins 531 and 534). Traces on respective top and bottom surfaces of base 510 may be connected through pins inserted through holes 591

Figure 15:
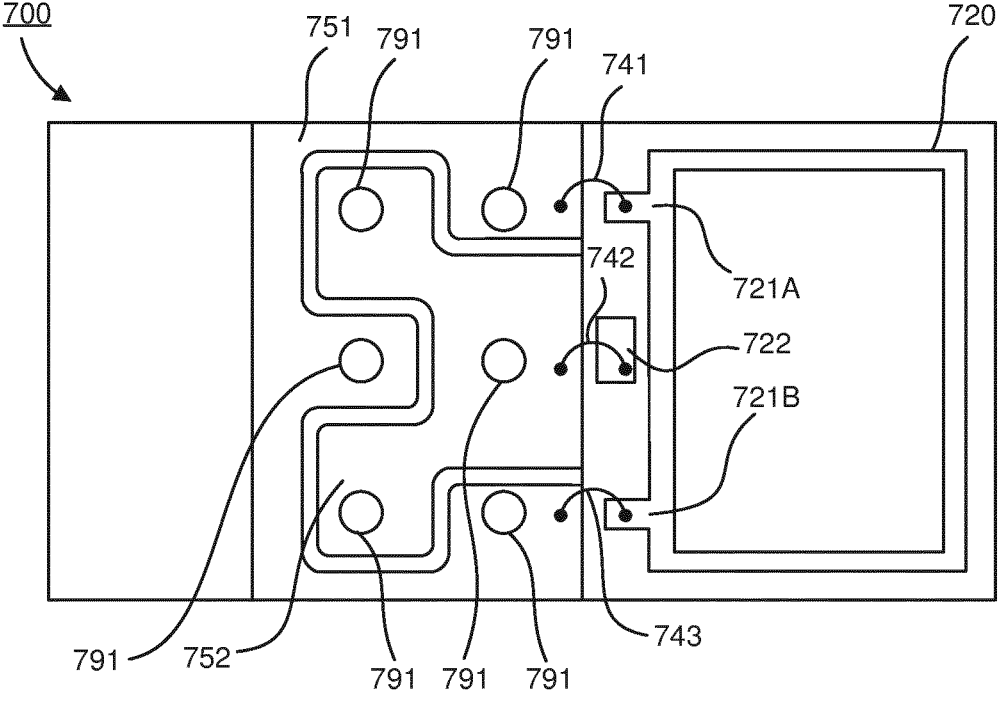
FIG. 15 illustrates an exemplary detector package and an exemplary connection arrangement, consistent with embodiments of the present disclosure.

Reference is now made to FIG. 15, which illustrates an exemplary detector package and connection arrangement, consistent with embodiments of the present disclosure. FIG. 15 shows a detector package 700 that may include a plurality of holes 791 for accommodating pins. Detector package 700 may be configured to accommodate a plurality of groups of pins. Detector package 700 may be configured to accommodate three or more groups of pins, each of the groups including two or more pins. Detector package 700 may include a sensing element 720 having a plurality of bonding pads. Sensing element 720 may include a first surface pad 721A, a second surface pad 721B, and a through-via pad 722.

Similar to detector package 500 of FIG. 11, detector package 700 of FIG. 15 may allow a sensing element to connect to a trace on the detector package by multiple bonding wires, thus reducing the amount of current flowing in individual bonding wires. For example, a first bonding wire 741 may connect first surface pad 721A to a trace 751 of detector package 700. A second bonding wire 742 may connect through-via pad 722 to a trace 752. Through-via pad 722 may be similar to pad 622 of FIG. 7 and FIG. 8C. Furthermore, a third bonding wire 743 may connect second surface pad 721B to trace 751 at a different location of detector package 700 relative to that of first bonding wire 741.

Detector package 700 may be configured to accommodate pins with a symmetry. For example, holes 791 are arranged in a 2×3 grid. There may be rotation symmetry about an axis at the center of the 2×3 grid. Pins connected to trace 751 may be connected to an anode, and pins connected to trace 752 may be connected to a cathode, or vice versa. Rotating the arrangement of pins 180 degrees may yield the same positioning of anode-connected and cathode-connected pins.

Detector package 700 may be configured to have three groups of pins. The groups of pins may correspond to horizontal rows of holes 791, as in the view of FIG. 15. For example, there may be a top group of pins, a middle group of pins, and a bottom group of pins. Positioning of anode-connected pins and cathode-connected pins may alternate among the groups.

Sensing element 720 may be connected to detector package 700 by bonding wires or by other connections. For example, in some embodiments, sensing element 720 may connect to a trace on detector package 700 by direct contact with a metal layer on the bottom surface of sensing element 720. In some embodiments, through-via pad 742 may be omitted.

Figure 16:
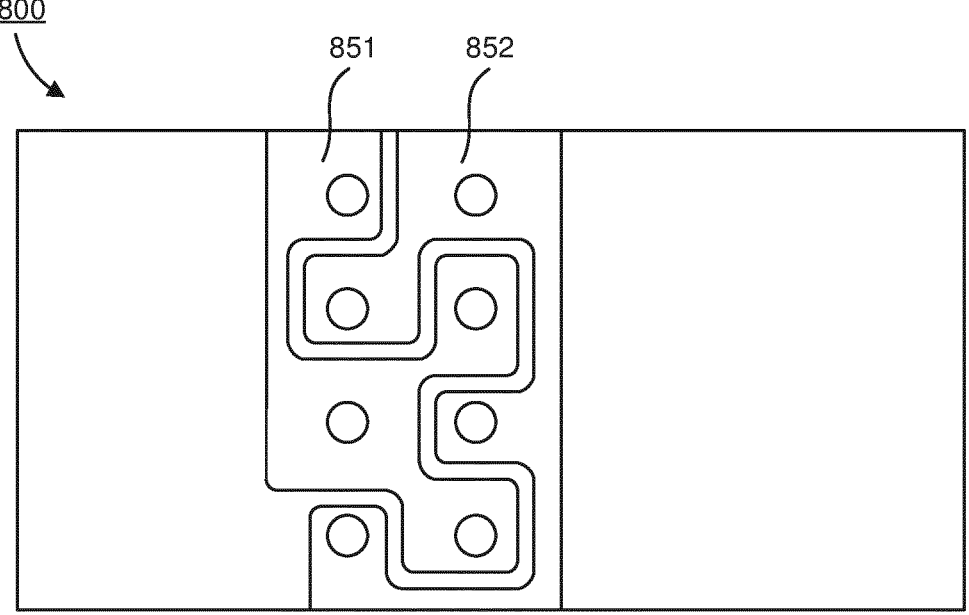
FIG. 16 illustrates an exemplary detector package and an exemplary connection arrangement, consistent with embodiments of the present disclosure.

Reference is now made to FIG. 16, which illustrates an exemplary detector package, consistent with embodiments of the present disclosure. FIG. 16 shows a detector package 800B that includes eight holes for accommodating pins. Detector package 800B may be configured to accommodate a plurality of groups of pins. Detector package 800B may be configured to accommodate four groups of pins, each of the groups including two pins. In the view of FIG. 16, groups of pins may correspond to horizontal rows of holes in detector package 800B. Trace 851 may connect one pin of each of the groups together. Trace 852 may connect the other of the pin of each of the groups together.

Detector package 800B may have symmetry. Detector package 800B may have rotation symmetry about an axis at the center of the 2×4 grid of holes as shown in FIG. 16. Positions of anode-connected pins and cathode-connected pins may alternate group by group.

Detector packages may be provided with symmetries in various arrangements. A detector package may have mirror symmetry about a line dividing top and bottom halves of the detector package. For example, detector package 700 of FIG. 15 may have symmetry by virtue of being reflection symmetric about a line dividing top and bottom halves of detector package 700.

Figure 17:
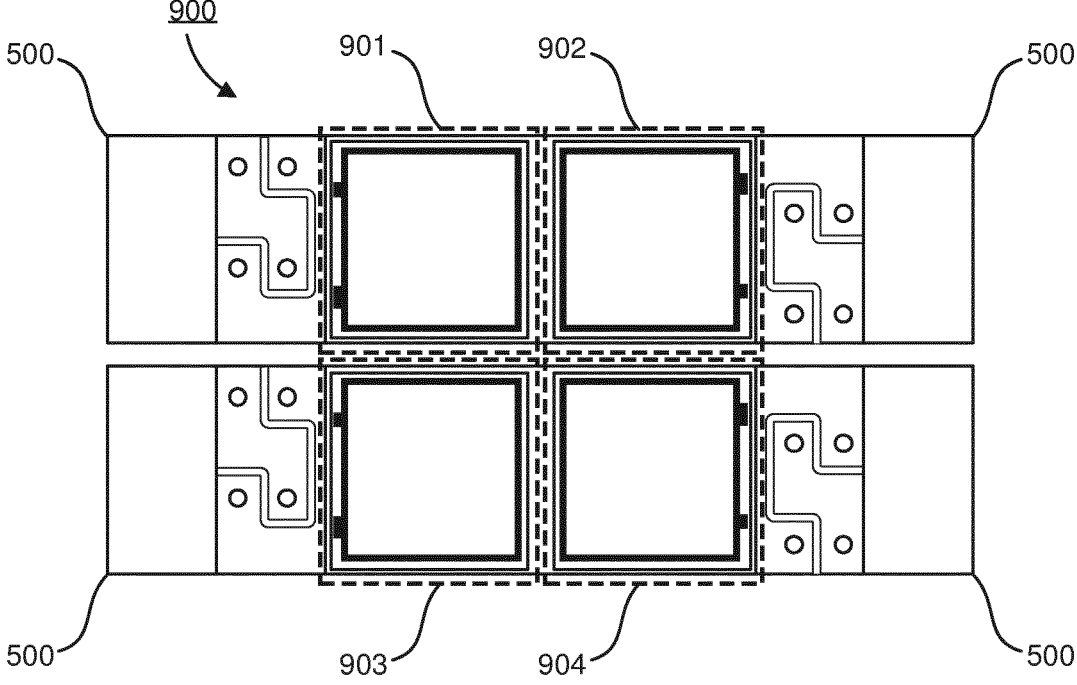
FIG. 17 illustrates an exemplary detector that may include a plurality of detector packages, consistent with embodiments of the present disclosure.

In some embodiments, a detector package may be provided as one of a plurality of detector packages in a detector system. FIG. 17 shows a detector system 900. Detector system 900 may include a plurality of detection cells 901, 902, 903, and 904. Each detection cell may correspond to one detector package 500. Thus, four detector packages 500 may be arranged together to provide four detection cells. A detector having multiple detection regions (e.g., detection sub-regions 246, 248, and 250 as discussed above with respect to FIG. 3B) may be provided by arranging multiple detector packages together, for example.

The embodiments may further be described using the following clauses:

1. A package for a charged particle detector comprising:
a package body that includes two sets of pins, each of the sets of pins including two pins,
wherein each pin of the sets of pins is configured to be connected to one of two terminals of a diode of the electron detector, and pins of different sets are configured to be connected to a different one of the two terminals of the diode, and wherein the sets of pins are arranged with a symmetry such that magnetic field generated
when current passes through a pin of the sets of pins reduces magnetic field generated by another pin of the sets due to the symmetry.

2. The package of clause 1, wherein the symmetry is a rotational symmetry about an axis at a center of the sets of pins.

3. The package of clause 1 or clause 2, further comprising:
a bonding wire configured to connect a first terminal of the diode with a first set of the sets of pins.

4. The package of clause 3, further comprising a second bonding wire configured to connect a second terminal of the diode with a second set of the sets of pins.

5. The package of any one of clauses 1-3, wherein the diode includes a second terminal configured to connect to the second set of the sets of pins by a trace on the package body.

6. The package of any one of clauses 1-5, wherein each of the sets of pins includes three pins.

7. The package of any one of clauses 1-6, wherein each of the sets of pins includes more than three pins.

8. The package of any one of clauses 1-7, wherein the pins are arranged in a grid.

9. The package of any one of clauses 1-8, wherein the sets of pins include a first group of pins and second group of pins, wherein the first group of the pins is arranged in a first row aligned with a terminal of the diode, and the second group of the pins is arranged in a second row aligned with a different terminal of the diode.

10. A detector package, comprising:
a body having a plurality of holes formed therein;
a sensing element; and
a plurality of pins configured to be inserted in the plurality of holes,
wherein the pins are arranged in a plurality of groups, each of the groups being aligned with a corresponding terminal of the sensing element,
each group includes a pin connected to a first terminal of the sensing element and a pin connected to a second terminal of the sensing element, and pins of a group are arranged alternately with respect to pins of another group.

11. The detector package of clause 10, wherein
the plurality of groups includes a first group and a second group,
the first group includes a first pin connected to the first terminal and a second pin connected to the second terminal, the second pin arranged closer to the sensing element than the first pin, and
the second group includes a third pin connected to the second terminal and a fourth pin connected to the first terminal, the fourth pin arranged closer to the sensing element than the third pin.

12. The detector package of clause 10 or clause 11, wherein the sensing element includes a semiconductor diode configured to generate an electrical signal in response to incidence of secondary charged particles.

13. The detector package of any one of clauses 10-12, wherein
the first terminal includes a first pad and the second terminal includes a second pad.

14. The detector package of clause 13, wherein the second terminal includes a via.

15. The detector package of any one of clauses 10-14, wherein
the sensing element includes a metal layer on a bottom side of the sensing element, and
the second terminal includes the metal layer.

16. The detector package of any one of clauses 10-15, further comprising:
a first trace on the body configured to connect two pins of different groups, and
a second trace on the body configured to connect two pins of different groups.

17. The detector package of clause 16, wherein the first trace and the second trace are separated by a serpentine region.

18. The detector package of any one of clauses 10-17, wherein the plurality of pins are arranged in a first set and a second set, wherein pins of the first set are connected to the first terminal and pins of the second set are connected to the second terminal, and
the first set and the second set are symmetric.

19. A detector configured to have a plurality of detector sub-areas, the detector including the detector package of clause 10, wherein a plurality of detector packages are provided in the detector, each of the detector packages corresponding to a respective one of the detector sub-areas.

20. A detector package, comprising:
a first set of pins;
a second set of pins; and
a sensing element,
wherein the first set of pins is electrically connected to a first terminal of the sensing element,
the second set of pins is electrically connected to a second terminal of the sensing element, and the first set of pins and the second set of pins are arranged with a symmetry about an axis at a center of the sets of pins such that magnetic field generated by a pin reduces magnetic field generated by another pin in a region around the axis.

21. The detector package of clause 20, wherein the first set of pins includes two pins extending through a base, and the second set of pins includes two pins extending through the base.

22. A detector package, comprising:

a body including a plurality of pins protruding therefrom, the plurality of pins extending in parallel; and a sensing element configured to generate a current in response to incidence of irradiation to be detected, the current flowing between a first terminal and a second terminal, wherein the plurality of pins are arranged in a plurality of groups, each pin included in a group being connected to a different one among the first terminal and the second terminal so as to enable current to flow in opposite directions between pins in the group, and wherein the plurality of groups includes a first group in which pins are arranged in close proximity in a first region and a second group in which pins are arranged in a close proximity in a second region such that magnetic fields generated by current flow through the plurality of pins is reduced.

23. The detector package of clause 10, wherein the plurality of pins includes a first set and a second set, wherein pins of the first set are connected to the first terminal and pins of the second set are connected to the second terminal.

It will be appreciated that the embodiments of the present disclosure are not limited to the exact construction that has been described above and illustrated in the accompanying drawings, and that various modifications and changes can be made without departing from the scope thereof.

The invention claimed is:

1. A package for a charged particle detector comprising:

a package body that includes two sets of pins, each of the sets of pins including two pins, wherein each pin of the sets of pins is configured to be connected to one of two terminals of a diode of the charged particle detector, and pins of different sets are configured to be connected to a different one of the two terminals of the diode, and wherein the sets of pins are arranged with a symmetry such that a first magnetic field generated when current passes through a pin of the sets of pins reduces a second magnetic field generated by another pin of the sets due to the symmetry.

2. The package of claim 1, wherein the symmetry is a rotational symmetry about an axis at a center of the sets of pins.

3. The package of claim 1, further comprising:

a bonding wire configured to connect a first terminal of the diode with a first set of the sets of pins.

4. The package of claim 3, further comprising a second bonding wire configured to connect a second terminal of the diode with a second set of the sets of pins.

5. The package of claim 1, wherein the diode includes a second terminal configured to connect to the second set of the sets of pins by a trace on the package body.

6. The package of claim 1, wherein each of the sets of pins includes three pins.

7. The package of claim 1, wherein each of the sets of pins includes more than three pins.

8. The package of claim 1, wherein the pins are arranged in a grid.

9. The package of claim 1, wherein the sets of pins include a first group of pins and second group of pins, wherein the first group of the pins is arranged in a first row aligned with a terminal of the diode, and the second group of the pins is arranged in a second row aligned with a different terminal of the diode.

10. A detector package, comprising:

a body having a plurality of holes formed therein;

a sensing element; and a plurality of pins configured to be inserted in the plurality of holes, wherein the pins are arranged in a plurality of groups, each of the groups being aligned with a corresponding terminal of the sensing element, each group includes a pin connected to a first terminal of the sensing element and a pin connected to a second terminal of the sensing element, and pins of a group are arranged alternately with respect to pins of another group.

11. The detector package of claim 10, wherein the plurality of groups includes a first group and a second group, the first group includes a first pin connected to the first terminal and a second pin connected to the second terminal, the second pin arranged closer to the sensing element than the first pin, and the second group includes a third pin connected to the second terminal and a fourth pin connected to the first terminal, the fourth pin arranged closer to the sensing element than the third pin.

12. The detector package of claim 10, wherein the sensing element includes a semiconductor diode configured to generate an electrical signal in response to incidence of secondary charged particles.

13. The detector package of claim 10, wherein the first terminal includes a first pad and the second terminal includes a second pad.

14. The detector package of claim 13, wherein the second terminal includes a via.

15. The detector package of claim 10, wherein the sensing element includes a metal layer on a bottom side of the sensing element, and the second terminal includes the metal layer.

16. The detector package of claim 10, further comprising:

a first trace on the body configured to connect two pins of different groups, and a second trace on the body configured to connect two pins of different groups.

17. The detector package of claim 16, wherein the first trace and the second trace are separated by a serpentine region.

18. The detector package of claim 10, wherein the plurality of pins are arranged in a first set and a second set, wherein pins of the first set are connected to the first terminal and pins of the second set are connected to the second terminal, and the first set and the second set are symmetric.

19. A charged particle detector system comprising:

a charged particle detector comprising a diode having two terminals; and a package body coupled to the charged particle detector, the package body including two sets of pins, each of the sets of pins including two pins, wherein each pin of the sets of pins is connected to one of two terminals of the diode, and pins of different sets are connected to a different one of the two terminals of the diode, and wherein the sets of pins are arranged with a symmetry such that as first magnetic field generated when current passes through a pin of the sets of pins reduces a second magnetic field generated by another pin of the sets due to the symmetry.

\* \* \* \* \*